(12) United States Patent
Ishii et al.

(10) Patent No.: US 6,825,525 B2
(45) Date of Patent: Nov. 30, 2004

(54) SEMICONDUCTOR MEMORY DEVICE

(75) Inventors: Tomoyuki Ishii, Hachiouji (JP); Kazuo Yano, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/338,001

(22) Filed: Jan. 8, 2003

(65) Prior Publication Data

US 2003/0141556 A1 Jul. 31, 2003

Related U.S. Application Data

(62) Division of application No. 09/811,555, filed on Mar. 20, 2001, now Pat. No. 6,646,300.

(30) Foreign Application Priority Data

Sep. 14, 2000 (JP) ........................................ 2000-279525

(51) Int. Cl.$^7$ ............................................ H01L 29/788
(52) U.S. Cl. ........................ 257/315; 257/316; 257/317; 257/319; 257/320
(58) Field of Search ................................ 257/314–317, 257/319, 320

(56) References Cited

U.S. PATENT DOCUMENTS

| | | | |
|---|---|---|---|
| 5,753,946 A | 5/1998 | Naiki et al. | 257/295 |
| 6,100,954 A | 8/2000 | Kim | 349/138 |
| 6,218,245 B1 | 4/2001 | Xiang et al. | 438/258 |
| 6,376,316 B2 | 4/2002 | Shukuri et al. | 438/275 |

FOREIGN PATENT DOCUMENTS

JP    2000-279525    9/2000

*Primary Examiner*—Thien F Tran
(74) *Attorney, Agent, or Firm*—Antonelli, Terry, Stout & Kraus, LLP

(57) ABSTRACT

A semiconductor memory device comprises a first transistor including a source region, a drain region, a first channel region of a semiconductor material formed on an insulating film and connecting the source region and the drain region, and a gate electrode for controlling potential of the first channel region; a second transistor including a source region, a drain region, a second channel region of a semiconductor material connecting the source region and the drain region, a second gate electrode for controlling potential of the second channel region, and a charge storage region coupled with the second channel region by electrostatic capacity; wherein the source region of the second transistor is connected to a source line, one end of the source or the drain region of the first transistor is connected to the charge storage region of the second transistor, the other end of the source or the drain region of the first transistor is connected to a data line.

10 Claims, 31 Drawing Sheets

SEMICONDUCTOR MEMORY DEVICE

This is a divisional of parent application Ser. No. 09/811,555, filed Mar. 20, 2001, now U.S. Pat. No. 6,646,300, the entire disclosure of which is hereby incorporated by reference.

BACKGROUND OF THE INVENTION

1. Field of the Invention

The present invention relates to semiconductor devices including field effect transistors, and, particularly, semiconductor storage devices, and a method of fabricating the same.

2. Description of the Related Art

Demand for the advanced functions of data processors has progressively increased with the evolution of multimedia. Since processes for processing audios and images need to process a large amount of data in a short time, the enhancement of the throughput of a data processor is essential. However, if the data processor has an individual logic chip and an individual memory chip, which are principal components of the data processor, the data path between the logic chip and the memory chip is a bottleneck that obstructs the enhancement of the throughput of the data processor.

A DRAM embedded chip integrally provided with a logic circuit and a DRAM (dynamic random-access memory) on a single chip has been developed to solve the above-noted problem. Techniques relating to such a DRAM embedded chip are mentioned in H. Ishluchi, et al., IEEE International Electron Devices Meeting, pp. 33–36 (1997). In view of the facility in integrating the components, an SRAM (static random-access memory) comprising memory cells of only logic transistors is preferable for use in a DRAM. However, since each memory cell of SRAM consists of six transistors, the memory cell needs a large cell area, and high cost makes it difficult to form an SRAM of a large capacity.

A proposed memory cell has been proposed which is called a gain cell, This structure is capable of operating even if the amount of stored charge of a DRAM cell is reduced. Charges are injected through a write transistor to a storage node and information can be read by virtue of the change of the threshold voltage of a read transistor caused by the stored charge for signal storage. Techniques relating to the present invention include a write transistor formed by polysilicon, mentioned in H. Shichijo, et al.. Conference on Solid State Devices end Materials, pp. 265–268 (1984), a read transistor formed by polysilicon, mentioned in S. Shukuri, at al., IEEE International Electron Devices Meeting, pp. 1006–1008 (1992), and single-electron memories formed by polysilicon, mentioned in K. Yano, et el., IEEE International Electron Devices Meeting, pp. 541–544 (1993) and K. Yano, at al., IEEE International 15 Solid-state Circuits Conferences. Pp. 266–267 (1996). These techniques relate to memory devices that use a single cell for signal storage. Although different from the present invention in the principle of operation and function of the memory cell, those techniques include a general configuration called a TFT configuration having a channel which is thinner than a source and a drain; that is, the bottom of the source/drain region is substantially flush with the thin film channel region.

The reduction of the power consumption of devices, including battery-powered devices such as personal digital assistants, is an important problem. Generally, a semiconductor device consumes most of the power consumed by an apparatus including the semiconductor device, and, hence, the reduction of power consumption of the semiconductor device is required. The current of a transistor in an OFF status is called a leakage current. Since the leakage current is a matter that can affect all the circuit elements on a chip, the current is one of factors of increasing power consumption of a whole semiconductor chip without distinction in case of as to whether the leakage current exists in a logic circuit or a memory circuit. Therefore, the reduction of power consumption of the semiconductor device is required. The inventors have found out that a TFT structure which includes a polycrystalline silicon base having a thin channel region causes a leakage current in the range of 1018. However, In case of a FET structure in which the thickness of a channel region is thinner than the thickness of a source and/or drain region, the base height of a source and/or drain region is almost the same as the height of a channel thin film region. A gate insulator layer of this structure is deposited by CVD. Therefore, a step between a top surface of a source and/or a drain region and a top surface of a channel region causes a concentration of an electrical field at a top portion of the step. Therefore, a margin of dielectric strength is reduced when a gate insulation layer is thinner. Some parts of a gate insulating film are thick at the lower portion of the above-said step, and, hence, the performance of the transistor deteriorates and it is possible that the short channel effect can become remarkable.

Accordingly, it is an object of the present invention to provide a low-leakage, high-performance semiconductor device.

Another object of the present invention is to provide a semiconductor device that operates at a low power consumption.

As mentioned above, techniques of integrating a logic circuit and a DRAM have been developed and DRAM embedded devices have been marketed. However, there is a problem in the compatibility of logic circuit fabricating processes and DRAM fabricating processes.

First, when the logic fabricating processes and the DRAM fabricating processes have only a few processes in common, many masks and steps are necessary, which increases manufacturing cost. A capacitor forming process, which is the most complicated process among those of fabricating the DRAM, cannot be used for forming the component of the logic circuit. Fast operation is an important capability of the logic circuit, and, hence, the diffusion layer of the MOS transistor of the logic circuit is silicided to reduce the resistance. However, if the diffused layer of the path transistor of the memory cell of the DRAM is silicided, leakage current increases and data retention time decreases greatly. Therefore, a region for the DRAM must be covered during a process for siliciding the diffusion layer of the logic circuit when forming MOS transistors for the circuit, which requires complicated processes.

Secondly, a high-temperature process for forming capacitors of a DRAM entails a problem. Since a DRAM must keep a high S/N ratio, a DRAM must achieve a large storage charge even in the face of continued cell size miniaturization. Therefore, a dielectric film having a high dielectric constant must be employed to keep the capacity in an smaller area. The use of a conventional three-dimensional structure is costly, and, hence, is infeasible, and a dielectric film having a high dielectric constant is indispensable even if a three-dimensional structure is used. A high-temperature process is necessary for forming a dielectric film having a high dielectric constant. For example, when forming a $Ta_2O_5$ film (tantalum pentoxide film), a high-temperature process is necessary that uses heat on the order of 750° C.

The pn junction of a MOS transistor of the logic is formed in a very shallow diffusion layer for miniaturization. An impurity is diffused out in the diffusion layer by a heat treatment, the characteristic of the MOS transistor is deteriorated, and the MOS transistor malfunctions due to punch through. A silicide, such as cobalt silicide, tends to aggregate when heated at a high temperature. When a trench capacitor structure is employed, in which a capacitor is formed in a trench formed in a substrate, capacitors can be formed before forming the MOS transistors of the logic. However, the trench must be very deep and the aspect ratio increases inevitably when the structure is produced by finer pattern.

The problem in keeping stored charge is not only with the embedded chip but also with DRAMs. There is the possibility that a new dielectric material having a high dielectric constant must be developed every time the generation advances after the generation of 1 Gb RAMs with a design rule in the range of 0.18 to 0.14 $\mu$m. Thus, a semiconductor memory capable of stably operating even if stored charge is reduced, and capable of being formed in a high level of integration corresponding to that of DRAM in a small area is necessary.

Accordingly, it is a third object of the present invention to provide a semiconductor device integrally provided with a high-performance logic and a memory and capable of being manufactured at a low cost.

The present invention provides a large-scale memory capable of properly operating even if semiconductor devices are produced by more fine pattern.

SUMMARY OF THE INVENTION

The present invention is characterized in reading a charge injection or charge emission through a write transistor by the change of the threshold voltage of a read transistor. A logic circuit can be easily combined because there is no need for any new material for securing capacitance for a DRAM. A transistor according to the present invention can be very effectively applied to such a semiconductor device.

According to a first aspect of the present invention, a semiconductor memory cell comprises a source region, a drain region, a channel region of a semiconductor material connecting the source region and the drain region, and a gate electrode for controlling the potential of the channel region, wherein the channel region is formed on an insulating film, and the channel region is disposed on a level corresponding to the upper surfaces of the source region and the drain region with respect to a surface of a substrate.

Preferably, the channel region is a thin semiconductor film of 5 nm or below in thickness. Since the channel region is a very thin semiconductor film, the leakage current is very small. This constitution will be understood by referring to FIG. 1.

According to a second aspect of the present invention, a semiconductor memory cell comprises: a first transistor structure (M2) including a source region of a metal or a semiconductor material, a drain region of a metal or a semiconductor material, a channel region of a semiconductor material formed on an insulating film and connecting the source region and the drain region, and a gate electrode of a metal or a semiconductor material for controlling the potential of the channel region; and a second transistor structure (M1) including a source region of a metal or a semiconductor material, a drain region of a metal or a semiconductor material, a channel region of a semiconductor material connecting the source region and the drain region, a gate electrode of a metal or a semiconductor material for controlling the potential of the channel region, and a charge storage region of a metal or a semiconductor material coupled with the channel region by electrostatic capacitance. In this arrangement, the source region of the second transistor structure is connected to a source line, the one end of the source or the drain region of the first transistor structure is connected to the charge storage region of the second transistor structure, and the other end of the source or the drain region of the first transistor structure is connected to a data line.

According to the present invention, a charge storage region (1) and a control electrode (5) of a read transistor are layered, and, hence, the cell can be formed in an area smaller than that of a three-transistor gain cell. Since the channel of a write transistor is a semiconductor thin film formed on an insulating film (134) and a charge leakage path in a channel (3) can be completely depleted, leakage current is far less than that in a device employing an MOS transistor formed on a bulk substrate as a write transistor.

The storage region (1) or the channel (3) of the write transistor can be formed by a self-alignment process in alignment with a word line (5). Thus, the cells of the semiconductor device can be formed by simple processes in small area. Reference characters used in the foregoing description are those used in FIG. 1.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1A:
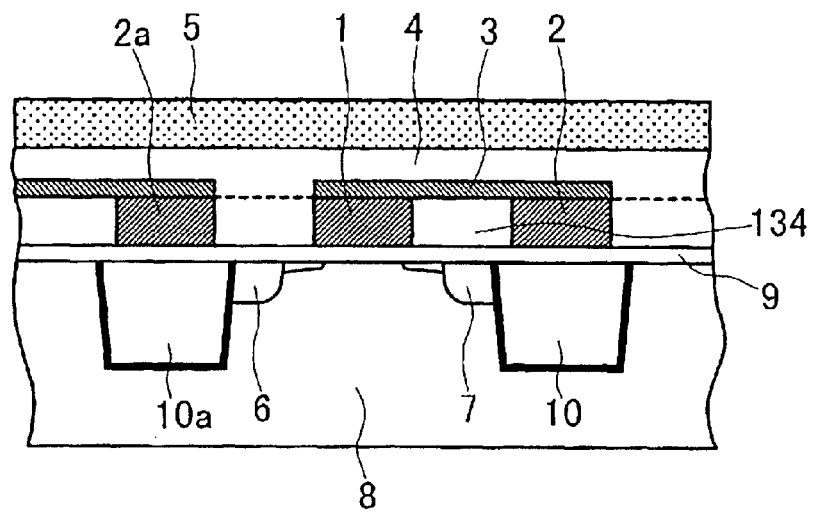
FIGS. 1(a), 1(b) and 1(c) are, respectively, a typical fragmentary sectional view, a typical fragmentary plan view and a circuit diagram, respectively, of a semiconductor memory device in a first embodiment according to the present invention.

Principal configurations of semiconductor memory devices according to the present invention will be described prior to the description of the preferred embodiments of the present invention.

According to a first mode of the present invention, a semiconductor memory cell comprises: a first transistor structure including a source region of a metal or a semiconductor material, a drain region of a metal or a semiconductor material, a channel region of a semiconductor material which is formed on an insulating film and connects the source region and the drain region, and a gate electrode of a metal or a semiconductor material which controls the potential of the channel region; and a second transistor structure including a source region of a metal or a semiconductor material, a drain region of a metal or a semiconductor material, a channel region of a semiconductor material connecting the source region and the drain region, a gate electrode of a metal or a semiconductor material which controls the potential of the channel region, and a charge storage region of a metal or a semiconductor material coupled with the channel region by electrostatic capacitance. In this arrangement, the source region of the second transistor structure is connected to a source line, one end of the source or drain region of the first transistor structure is connected to the charge storage region of the second transistor structure, and the other end of the source or drain region of the first transistor structure is connected to a data line. This semiconductor memory cell structure can be applied to form various semiconductor memory devices.

According to a second mode of the present invention, in the semiconductor memory cell or the semiconductor device in the first mode of the present invention, the distance between the source or drain region of the first transistor structure connected to the data line and the source region of the second transistor structure is shorter than the distance between the source or drain region of the first transistor structure connected to the data line and the drain region of the second transistor structure.

According to a third mode of the present invention, in the semiconductor memory cell in the first or second mode of the present invention, the width of the gate electrode of the second transistor structure is substantially equal to that of the channel region of the first transistor structure. The semiconductor memory cell in the third mode of the present invention is featured by the use of a self-alignment process using the electrodes of the read transistors of the semiconductor memory cells.

According to a fourth mode of the present invention, in the semiconductor memory cell in any one of the first to the third mode of the present invention, the width of the gate electrode of the second transistor structure is substantially equal to that of the charge storage region of the second transistor structure.

According to a fifth mode of the present invention, a semiconductor memory cell comprises write and read transistors of a field effect type; wherein the channel of the write transistor is formed of a semiconductor material, the source and drain regions of the write transistor are formed of a metal layer or a laminated structure of a metal layer and a semiconductor layer, one end (region A) of either the source or the drain region of the write transistor does not have any conductive path other than the channel of the write transistor and is coupled with the channel of the read transistor by electrostatic capacitance, the other end (region B) of either the source or the drain region of the write transistor is connected to an external circuit, the amount of charge stored in the region A of the write transistor is changed in order to change the threshold voltage of the read transistor to store information, and the channel of the write transistor is connected to metallic parts of the source and drain regions of the write transistor. This semiconductor memory cell is applied to a semiconductor memory device.

According to a sixth mode of the present invention, a semiconductor memory device is provided which comprises: transistors including gate insulating films having at least two levels of thickness; a peripheral circuit including transistors having a gate insulating film which is not the thinnest gate insulating film among the gate insulating films; and a memory cell including memory which includes a write field-effect transistor and a read field-effect transistor on the same chip, a charge which is charged and discharged through the write field-effect transistor which is read through the change in threshold voltage of the read field-effect transistor. In this arrangement, the thickness of the gate insulating film of the component transistors of the peripheral circuit is equal to that of the gate insulating film of the read transistors of the memory cell.

According to a seventh mode of the present invention, in the semiconductor memory cell or the semiconductor device in any one of the first to the sixth modes of the present invention, the channel of the write transistor is formed on an insulating film.

According to an eighth mode of the present invention, in the semiconductor memory cell or the semiconductor device in the seventh mode of the present invention, the channel of the write transistor is on a level corresponding with the upper end of the source or the drain region of the write transistor.

According to a ninth mode of the present invention, in the semiconductor memory cell or the semiconductor device according to any one of the first to the seventh modes of the present invention, the gate electrode of the write transistor serves also as the gate electrode of the read transistor.

According to a tenth mode of the present invention, in the semiconductor memory cell or the semiconductor device according to any one of the first to the eighth modes of the present invention, the thickness of the channel of the write transistor is 5 nm or below.

According to an eleventh mode of the present invention, a memory cell array is formed by arranging semiconductor memory cells identical to those described in any one of the first to the tenth modes of the present invention in a matrix, wherein isolation regions isolating memory cells of the memory cell array are arranged in substantially parallel rectangles, the word lines connected to the gate electrodes of the write or read transistors of the semiconductor memory cells are arranged in substantially parallel rectangles, the plurality of read transistors of the semiconductor memory cell are connected by diffusion layers, the diffusion layers are arranged in substantially parallel rectangles, the isolation regions arranged in substantially parallel rectangles and the diffused layers arranged in substantially parallel rectangles are substantially parallel to each other, and the parallel rectangular isolation regions and the parallel word lines are substantially perpendicular to each other.

According to a twelfth mode of the present invention, a memory cell array is formed by arranging semiconductor memory cells equivalent to those described in any one of the first to the tenth modes of the present invention in a matrix, wherein the isolation regions of the memory cell array are arranged in substantially parallel rectangles, the word lines connecting the gate electrodes of the write or the read transistors of the semiconductor memory cells are arranged in substantially parallel rectangles, a plurality of read transistors of the memory cell are connected to each other by lines made of the same material as that of a gate electrode, the parallel rectangular isolation regions and the parallel word lines are substantially perpendicular to each other, the lines connecting the plurality of write transistors are parallel to the parallel rectangular isolation regions, and lines connecting the plurality of write transistors are extended on the parallel rectangular isolation regions.

According to a thirteenth mode of the present invention, a memory cell array is formed by arranging semiconductor memory cells identical to those described in any one of the first to the tenth modes of the present invention in a matrix, wherein isolation regions included in the memory cell array are arranged in substantially parallel rectangles, the word lines connected to the gate electrodes of the write or read transistors of the semiconductor memory cells are arranged in substantially parallel rectangles, each of the read transistors of the semiconductor memory cells shares the diffusion layer of the drain region with only one adjacent cell, the source lines of the read transistors of at least three cells of the plurality of read transistors are connected by the diffusion layer or a metal wiring line, the isolation regions arranged in substantially parallel rectangles and the diffused layers arranged in substantially parallel rectangles are substantially parallel to each other, and the parallel rectangular isolation regions and the parallel word lines are substantially perpendicular to each other.

According to a fourteenth mode of the present invention, a memory cell array is formed by arranging semiconductor memory cells identical to those described stated in any one of the first to the thirteenth mode of the present invention in a matrix, wherein information of at least two bits is stored in one cell.

According to a fifteenth mode of the present invention, a memory cell array is formed by arranging semiconductor memory cells identical to those described in any one of the first to the fourteenth modes of the present invention in a matrix, wherein a register that enables the storage of information of at least two bits is connected to a unit read data line.

According to a sixteenth mode of the present invention, a memory cell array is formed by arranging semiconductor memory cells identical to those described in any one of the first to the fifteenth modes of the present invention in a matrix, wherein a register that enables the storage of information of at least two bits is connected to a unit write data line.

According to a seventeenth mode of the present invention, a memory cell array is formed by arranging semiconductor memory cells identical to those described in any one of the first to the sixteenth modes of the present invention in a matrix, wherein a semiconductor memory device control method comprises a first read step and a second read step of driving the same word line and read data line as those driven in the first step, wherein the second read step changes the voltage of the word line according to the result of the read operation in the first read step.

According to an eighteenth mode of the present invention, a memory cell array is formed by arranging semiconductor memory cells identical to those described in any one of the first to the seventeenth modes of the present invention in a matrix, wherein a semiconductor memory device control method comprises a first read step and a second read step of driving the same word line and read data line as those driven in the first step, wherein the potential of a write data line is set according to the combination of the result of the read operation in the first read step and the result of the read operation in the second read step.

Preferred embodiments of the present invention will be concretely described hereinafter.

First Embodiment

Figure 1B:
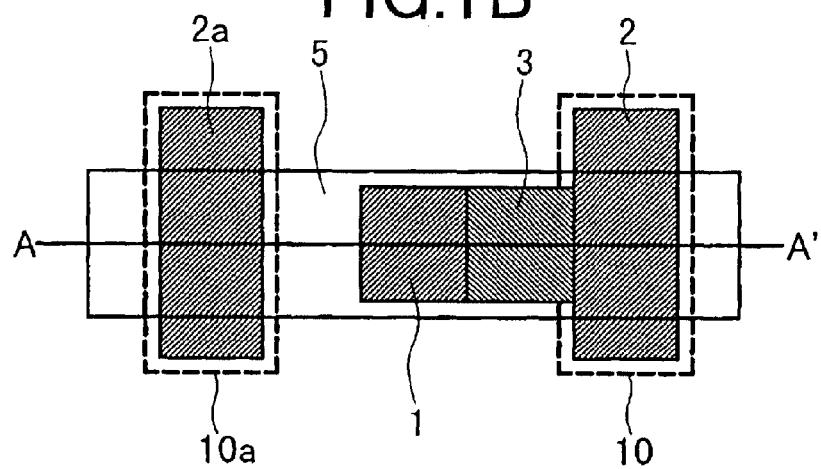
Figure 1C:
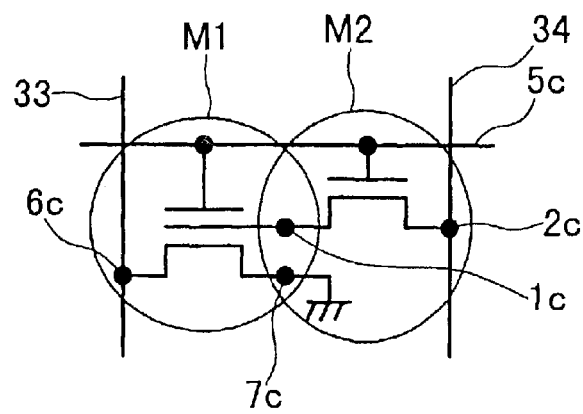

A semiconductor memory device in a first embodiment according to the present invention is formed on a semiconductor substrate. FIGS. 1(a), 1(b) and 1(c) are, respectively, a sectional view, a top view and a circuit diagram of an equivalent circuit of a memory cell included in the semiconductor memory device in the first embodiment. In FIG. 1(b), some parts of the overlapping outlines of regions are shifted relative to each other to facilitate understanding, and components shown in FIGS. 1(a) to 1(c) correspond with each other. FIG. 1(b) shows the positional relationship between the principal parts of the memory cell but does not accurately show layers.

Basically, the memory cell is integrally provided with a write transistor M2 for writing information and a read transistor M1 for reading stored information. The memory cell is the so-called gain cell structure including thin-film FETs (field effect transistors).

The write transistor M2 is a thin-film FET. The concentration of impurities in the channel 3 of the FET is low, and the channel 3 is substantially intrinsic. Opposite end parts 1 and 2 of the channel 3 are connected to a laminated structure of an n-type polysilicon layer and a W layer (tungsten layer). The end part 1 is only connected to the channel 3 and is not connected to any other conductive path. The end part 1 serves as a charge storage region 1. The end part 1 corresponds to a part 1c in the equivalent circuit diagram shown In FIG. 1(c). The other end part 2 is connected to a write data line 34. The end part 2 corresponds to a part 2c in the equivalent circuit diagram. The laminated layer of the polysilicon layer arid the W layer is the one prevalently used in the field of semiconductor technology. Preferably, the W layer of the laminated structure is in contact with the channel to utilize the low resistance of the W layer.

The end part 2 connected to the write data line 34 overlies an isolation region 10. The thickness of the channel 3 is, for example. 6 nm. A 7 nm thick gate insulating film 4 of $SiO_2$ is formed over the channel 3, and a gate electrode 5 of a laminated structure consisting of a p-type polysilicon film and a W film is formed over the gate insulating film 4. The gate insulating film 4 consists of a first $SiO_2$ layer which is formed over a second $SiO_2$ layer 134. In FIG. 1(a), a dotted line indicates the boundary between the first and the second $SiO_2$ layer. In other drawings, this laminated structure of the first and second $SiO_2$ layers will be represented by a single insulating film for simplicity.

In FIG. 1(b), reference numerals 1 and 2 respectively indicate a source region or a drain region, and reference numerals 3 indicates a channel region.

The read transistor M1 uses the charge storage part 1 as the gate of an ordinary MOS transistor, and is provided with a self-aligned n-type source region 7 and a self-aligned n-type drain region 6. The source region. 7 of the read transistor M1 is grounded through a source line, as indicated at 7c in the equivalent circuit diagram. Although the region 7 can be used as a drain region, it is preferable to use region 7 as a source for stable data retention.

The drain region 6 of the read transistor M1 is connected to a read data line 33 at a point 6c in FIG. 1(c). A 6 nm thick insulating film 9 is formed between a charge storage part 1 and a silicon substrate 8. The insulating film 9 is an $SiO_2$ film with a nitride treatment. The gate electrode 5 of the read transistor M1 also serves as the gate electrode of the write transistor M2. The gate electrode 5 is indicated at 5c in FIG. 1(c). Although the read transistor M1 is an n-channel transistor in this embodiment, It may be a p-channel transistor instead. Although threshold voltage shifts when storing charges, and the sign end magnitude of the applied voltage change when the read transistor M1 is a p-channel transistor, the performance of the p-channel transistor is substantially the same as that of the n-channel translator. The read transistors in this and other embodiments are n-channel transistors for simplicity, although p-channel transistors may be used instead.

The operation of the memory cell of the semiconductor memory device in the first embodiment will now be described. The threshold voltage of the write transistor M2 is higher than that of the read transistor M1 because the gate electrode of the write transistor M2 is of a p-type, the channel film of the write transistor M2 is thin, and the channel impurity of the read transistor M1 is adjusted. The threshold voltage of the read transistor M1 is dependent on the amount of charge stored in the charge storage region. Therefore, the threshold voltage of the write transistor M2 is determined so as to be higher than the second high threshold voltage of the used storage state; that is, a threshold voltage which is higher than the threshold voltage for a low threshold voltage state of storage states when each cell stores one bit.

When a voltage VWW is applied to the gate electrode 5 (5c), the write transistor M2 turns on and a current flows through the channel 3 of the write transistor M2. Thus, an amount of charge dependent upon the predetermined potential of the write data line is stored in the charge storage part 4.

The write data line 34 and the read data line 33 are driven individually. When the voltage VW is applied to the gate electrode 5 (5c) for writing, the read transistor is M1 turned on. Therefore, a current flows through the read transistor M1 when writing and reading share the data line. In this embodiment, the current can be reduced by keeping the read data line open or equipotential with the source, so that the power consumption of the read transistor M1 can be suppressed.

When a write data line and a read data line share the same line, the read transistor M1 turns on, and the set potential of the write data line becomes equal to that of the drain 6 (6c) of the read transistor M1, and the potential of the channel of the read transistor M1 approaches the potential of the drain 6 (6c) of the read transistor M1. Consequently, when a voltage corresponding to written data is set for the write data line, the potential difference between the charge storage part 4 and the channel of the read transistor M1 increases because the potential difference between the charge storage part 4 and the channel of the read transistor M1 increases when the data line is driven individually, and the potential of the write data line is fixed approximately at the potential of the source. Thus, the change of the signal amount in reading is increased and it is achieved to store information more stably.

The use of two values "0" and "1" for setting the potential of the write data line provides the greatest margin. Two bits may be stored by setting four voltages for the data line, which reduces the cost per unit of storage capacity.

In the first embodiment, the read transistor M1 and the write transistor M2 share the word line. However, the read transistor M1 and the write transistor M2 may use two individual word lines, respectively. Although the use of the two individual word lines increases the area, the potential of the word line of the write transistor M2 can be fixed in the read operation, which ensures a more stable operation. Thus, a writing operation does not need to be performed immediately after a read operation. Since the write operation can be performed with the read transistor M1 kept in an off-state, power consumption can be reduced.

When reading stored information, a positive voltage 20 is applied to the gate electrode 5. This pulse voltage VWR is lower than the voltage VWW and current scarcely flows through the channel 3 of the write transistor M2. Therefore, information can be retained for a sufficiently long time as compared with the pulse width of the pulse voltage VWR.

The threshold voltage of the read transistor M1 varies according to the amount of stored charge and conductance changes when the read voltage is applied thereto. This is sensed as read information. As compared with a DRAM that supplies the stored charge to the data line and senses the potential change, the amount of stored charge changes the threshold voltage, the read transistor M1 amplifies the amount of stored charge, and a signal is sent out from the memory cell. Thus, the amount of stored charge may be small. The potential of the source 7 of the read transistor M1 is fixed, and the other end is used as the drain 6 for read precharge to suppress the variation of the potential of the channel 3 of the read transistor M2 and to hold the stored charge stably.

To compensate for the change of the stored charge due to a slight current that flowed through the write transistor M2 during the read operation, the write operation is performed again according to the read information. In a holding operation, a voltage VWO lower than the read voltage VWR is applied to the gate electrode 5. The write transistor M2 turns off. In this state, the leakage current that flows between the source 1 and the drain 2 is smaller than that which flows in the ordinary MOS transistor because the channel 3 is thin and is completely depleted. If a bulk silicon substrate is employed, leakage current from a pn-junction flows through the substrate. In the memory cell in the first embodiment, there is no leakage path corresponding to this substrate, and, hence, leakage current is small.

Figure 2A:
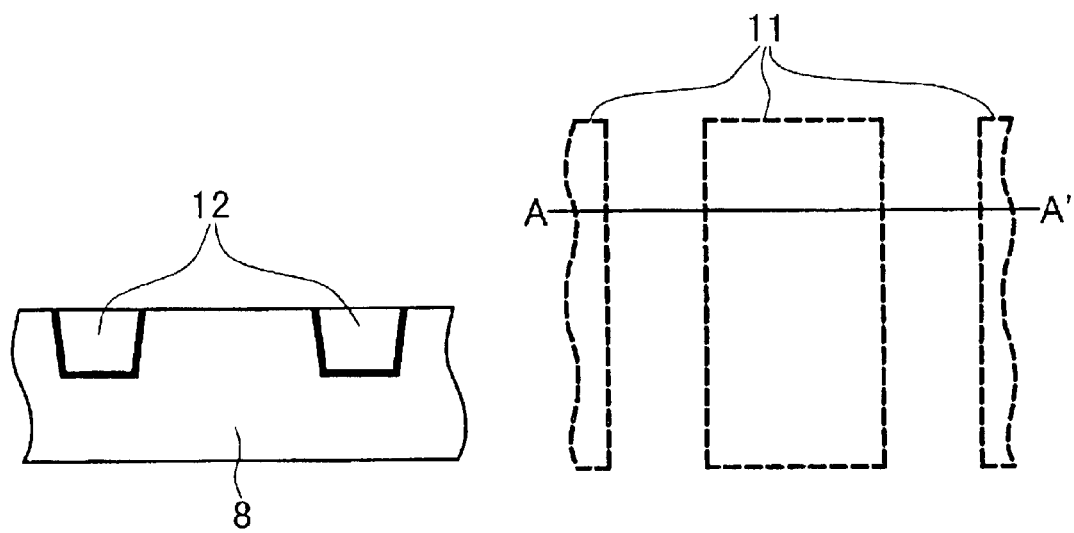
FIGS. 2(a) and 2(b) are views for explaining a method of fabricating the semiconductor memory device in the first embodiment.
Figure 5A:
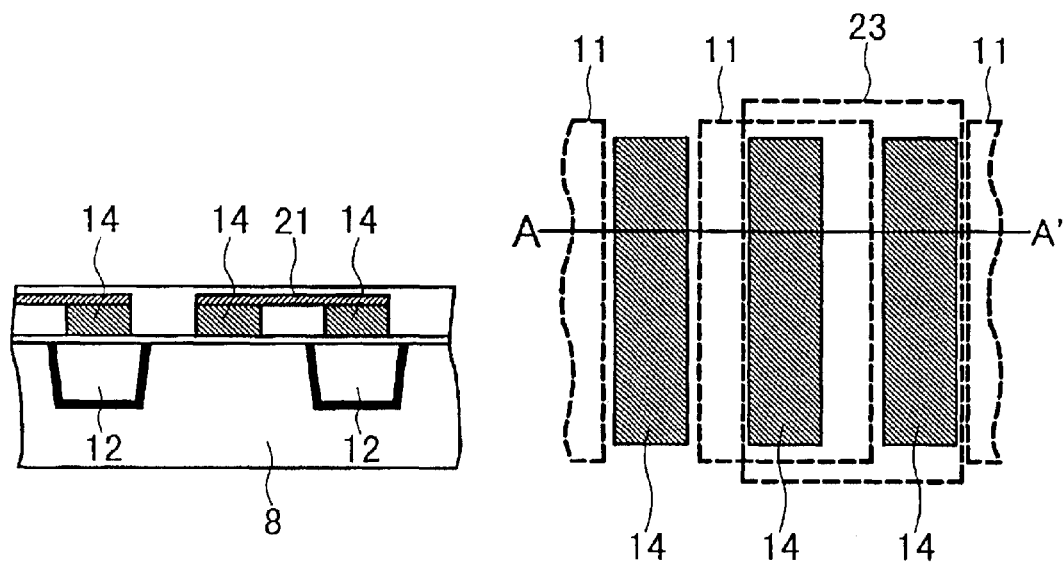
FIGS. 5(a) and 5(b) are views for explaining a method of fabricating the semiconductor memory device in the first embodiment.
Figure 5B:
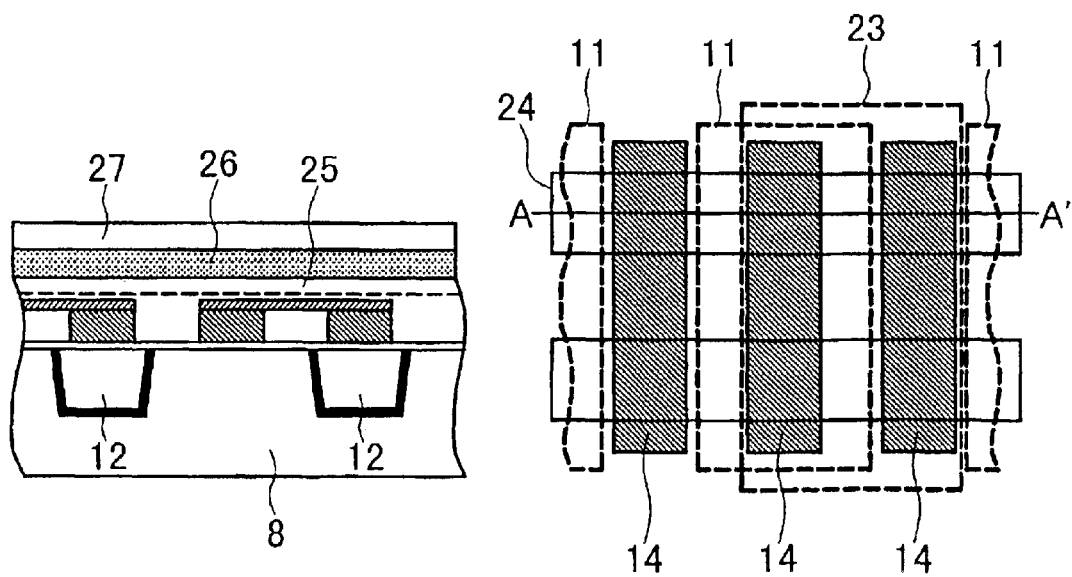
Figure 6A:
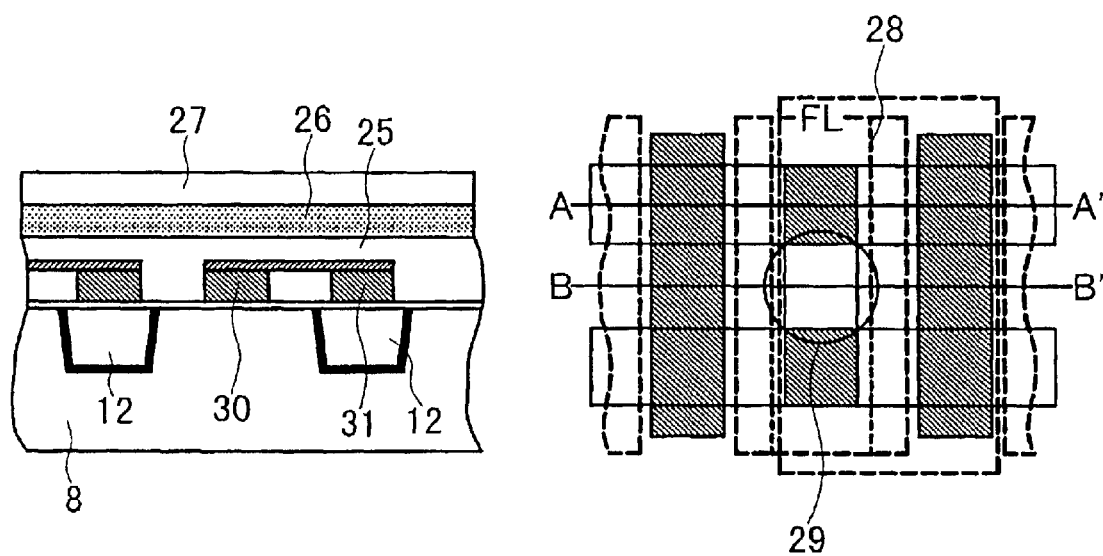
FIGS. 6(a) and 6(b) are views for explaining a method of fabricating the semiconductor memory device in the first embodiment.

A method of fabricating the semiconductor memory device in the first embodiment which has memory cells identical to the foregoing memory cell according to the present invention and is arranged in a matrix will now be described with reference to FIGS. 2 to 6. In FIGS. 2, 5 and 6, sectional views are on the left side and top views are on the right side. In each of the FIGS. 2, 5 and 6, the sectional view on the left side is taken on line A—A in the top view on the right side. Those top views only show principal components relevant to the corresponding steps of the process and are not accurate top views. Each of the sectional views only shows a structure above a semiconductor layer in which active regions of the semiconductor memory device are formed. The semiconductor layer is formed in a semiconductor substrate or a SOI substrate. In FIGS. 2 to 6, the substrate is omitted for simplicity. In FIGS. 3(b), 4, 5 and 6, impurity regions formed in the substrate are omitted. Those regions can be understood from FIG. 3(a).

Figure 2B:
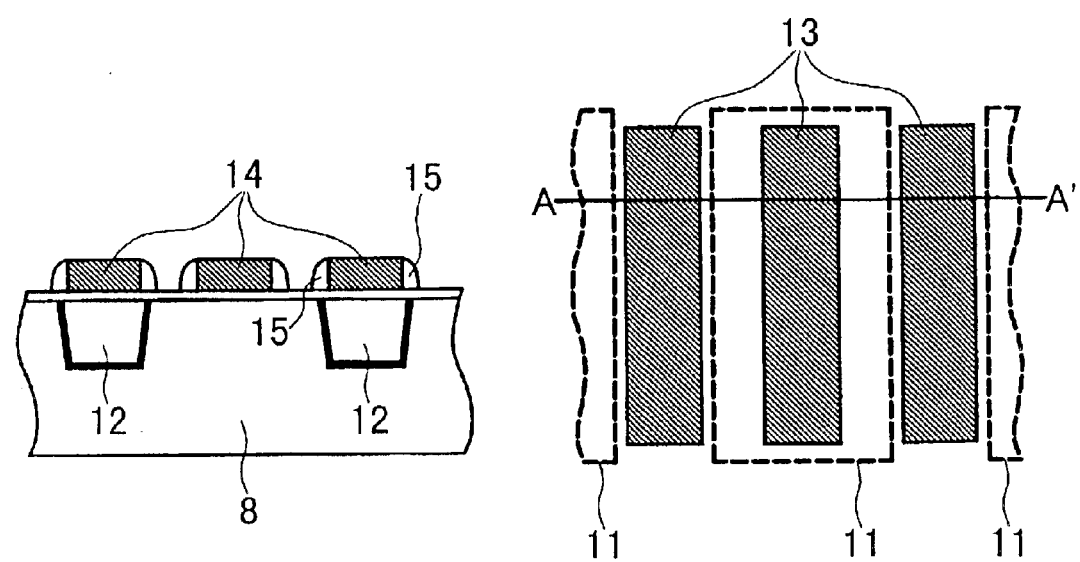

A p-type silicon substrate is subjected to ion implantation and annealing to form a triple well structure of an n-type well and a p-type well. As shown in FIG. 2(b), isolating grooves 12 filled with an insulating material are formed by using a masking pattern 11, shown in FIG. 2(a). The isolating grooves 12 are formed in regions that are not covered with the masking pattern 11. The masking pattern 11 corresponds to a plurality of memory cells.

After processing the surface of the substrate by sacrificial oxidation, a resist pattern is formed over the surface of the substrate and the surface of the substrate is doped with an impurity for threshold voltage adjustment. After cleaning the substrate, the surface of the silicon substrate is oxidized to form a 5 nm thick gate insulating film of $SiO_2$ for a peripheral circuit. A resist pattern having openings corresponding to regions for a logic circuit is formed on the substrate, and the gate insulating film of $SiO_2$ is etched through the resist pattern.

The resist pattern is removed and the surface of the silicon substrate is oxidized to form a 3 nm thick gate insulating film for the logic circuit. The surface of this gate insulating film is nitrided to increase the dielectric constant of the gate insulating film, a polysilicon film for forming the gate electrodes is deposited, and the polysilicon film is doped with an impurity through a mask of a resist film. Then, a W film and an $SiO_2$ film are deposited and gate electrodes 14 as shown in FIG. 2(b), are formed by using a resist pattern 13. The gate electrodes 14 are formed at substantially equal intervals to enable the use of resolution enhancement technology, such as phase-shift exposure.

Figure 3A:
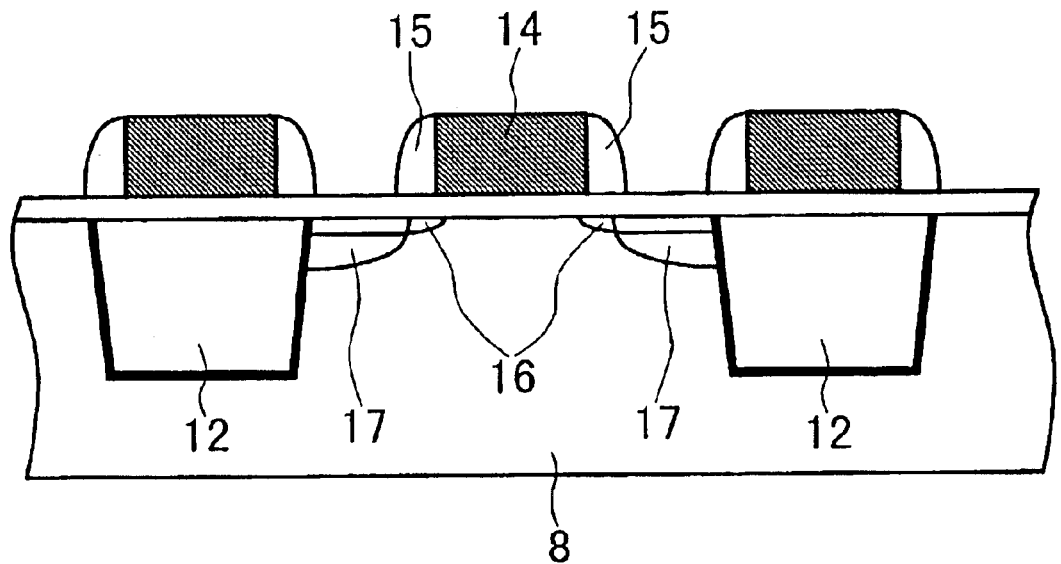
FIGS. 3(a) and 3(b) are views for explaining a method of fabricating a write transistor included in the semiconductor memory device in the first embodiment.

A low-energy impurity implantation using a resist pattern and gate electrodes as a mask is performed to form a shallow diffusion layer 16 in the semiconductor substrate 8, as shown in FIG. 3(a). Then, an $SiO_2$ film or an $Si_3N_4$ film is deposited, and the $SiO_2$ film or the $Si_3N_4$ film is 10 subjected to anisotropic etching to form side walls 15 on the side surfaces of the gate electrodes 14. Then, an impurity implantation is performed by using a resist pattern and the gate electrodes 14 coated with the side walls 15 as a mask to form diffusion layers 17, as shown in FIG. 3(a).

An oblique impurity implantation for implanting an impurity of a polarity opposite that of the diffusion layer may be performed before and after ion implantation to increase the well density of the end parts of the gate electrodes 14 in order to suppress the short channel effect. A silicidation process is performed to reduce the resistance of the diffusion layer by forming, for example, titanium silicide or cobalt suicide.

Figure 3B:
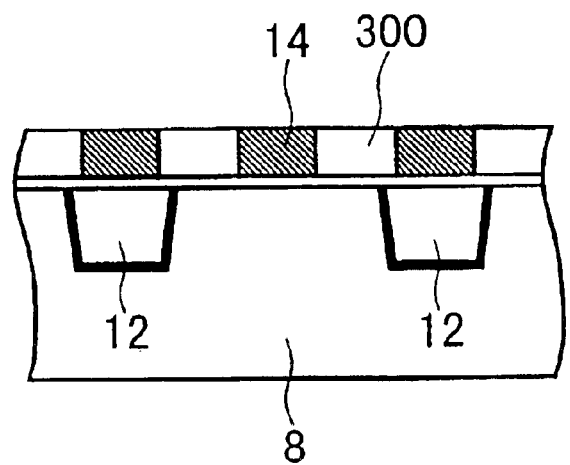
Figure 4A:
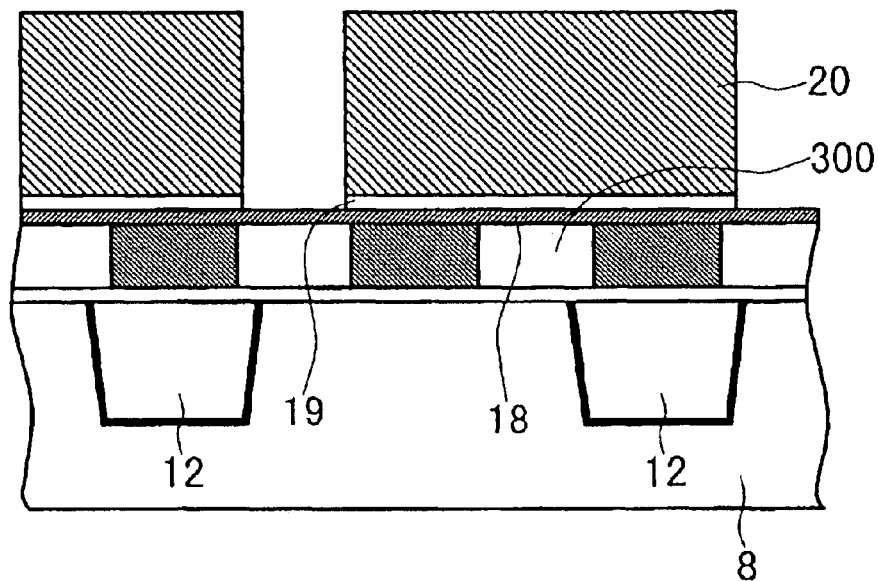
FIGS. 4(a) and 4(b) are sectional views for explaining a method of processing a channel included in the semiconductor memory device in the first embodiment.
Figure 4B:
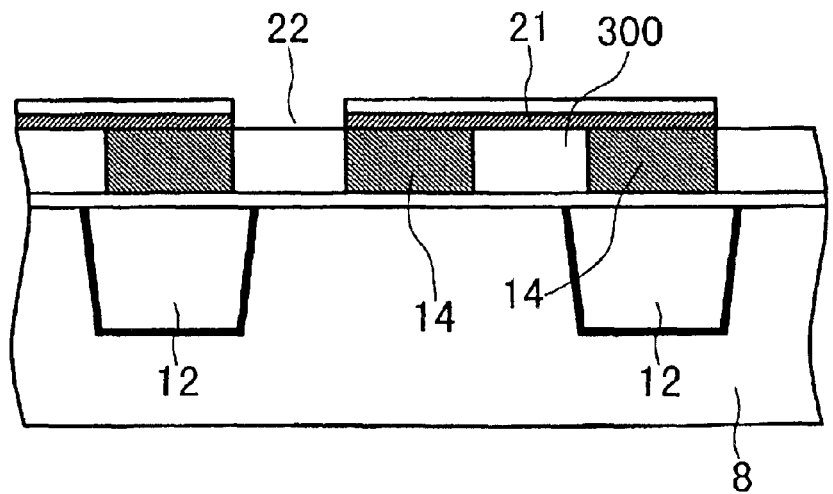

Subsequently, an $SiO_2$ film 300 is deposited and is polished by a chemical mechanical polishing process (CMP process) so that the surface of the $SiO_2$ film 300 is flush with the upper ends of the gate electrodes 14, as shown in FIG. 3(b). In FIG. 3(B) portions of the $SiO_2$ film 300 remaining after the CMP process are shown. FIG. 3(c) is a top view of the principal parts after CMP.

The semiconductor substrate thus processed is then cleaned. Next, an 8 nm thick amorphous silicon film 18 and a 5 nm thick $SiO_2$ film 19 are deposited in that order on the semiconductor substrate. The $SiO_2$ film 19 and the amorphous silicon film 18 are etched in a pattern shown in FIG. 4(b) by dry etching, using a resist pattern 20 shown in FIG. 4(a). The resist pattern 20 is formed by using a mask 23 of a pattern shown in FIG. 5(b).

Then, an $SiO_2$ film 25, a p-type polysilicon film, a W film and an $SiO_2$ film 27 are deposited. Dry etching using a resist pattern 23 is performed to form word lines 26, as shown in FIG. 5(b). The word lines 26 are formed by etching a laminated film consisting of the p-type polysilicon film and the W film. The p-type polysilicon film is used to create a positive threshold voltage in the write transistors. The word lines 26 serves also as the gate electrodes of the read and write transistors. The thickness of the $SiO_2$ film 27 overlying the word lines 26 is sufficiently thicker than the gate insulating film 25 of the transistors.

Figure 6B:
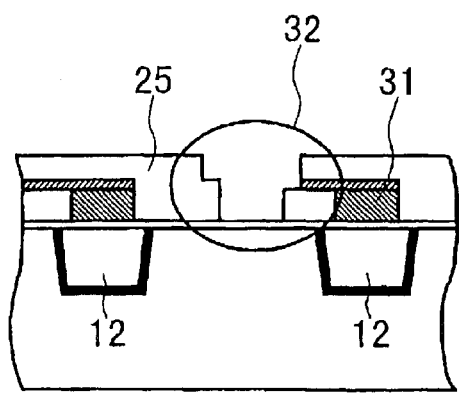

The $SiO_2$ film is etched by dry etching using a mask of a resist having a pattern 28 of openings as shown in FIG. 6(b). Even when the parts 29 of the $SiO_2$ film that are not overlapping the word lines 26 are etched as deeply as the gate electrodes 14 are exposed, the parts of the SiO$_2$ film 27 overlying the word lines remain. When etching the gate electrodes 14 thereafter, the etch selectivity between the parts of the SiO$_2$ film 27 overlying the word lines and the gate electrodes 14 is sufficiently large. FIG. 6(c) is a sectional view of the parts not overlying the word lines 26. Parts 29 and 32 of the gate electrodes 14 not overlying the word lines 26 are not etched, and charge storage regions 30 not having any discharging paths other than the channels 21 of the write transistors are formed. The adjacent gate electrodes 31 are not cut in this way, and they extend perpendicularly to the paper. The gate electrodes 31 serve as the data lines of the write transistors. Since the films are processed by self-alignment processes, the widths of the channels 21 of the write transistors and the charge storage regions 30 are substantially equal to that of the word lines 26. Subsequently, a wiring process is performed to form desired wiring lines.

This semiconductor memory device fabricating method 25 that uses a self-alignment process in its steps is able to form the word lines at minute pitches. The pitches are 2F, where F is the feature size of the technique employed. In this case, the width of lines is F, the width of spaces is F, and a line and a space are formed in a width of 2F.

The data lines are arranged at pitches of about 4F because the data line is a set including a write data line and a charge storage part. The pitches increase further when a large allowance is provided for registering the write data lines to the isolation regions or when the read data lines are formed in a large width to reduce resistance. Thus, the unit cell has an area in the range of 8F$^2$ to 12F$^2$ and the semiconductor memory device has a small area even though the transistors are arranged in a plane.

Figure 7:
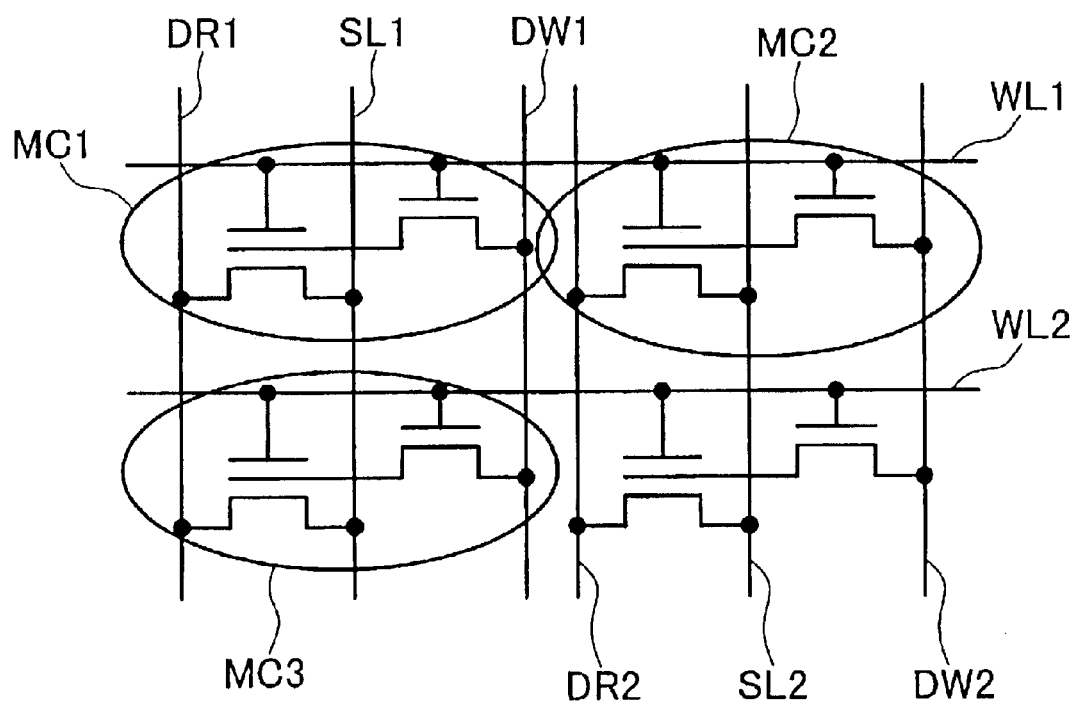
FIG. 7 is a circuit diagram of the array configuration of the semiconductor memory device in the first embodiment.

FIG. 7 is a circuit diagram of an equivalent circuit 15 of a memory cell array comprising the memory cells according to the present invention. Table 1 tabulates set voltages for operations. Shown in FIG. 7 are four memory cells arranged in a matrix. In FIG. 7, MC1, MC2 and MC3 indicate three of the four memory cells. The memory cells are arranged in columns sharing write data lines DW1 and DW2, read data lines DR1 and DR2 and source lines SL1 and SL2, and also in rows sharing read/write word lines WL1 and WL2.

TABLE 1

|  |  | Write | | Read | | |
| --- | --- | --- | --- | --- | --- | --- |
|  |  | Data set | Write | Precharge | Read | Retention |
| Selected | Write data line 1 (DW1) | VD1"1" VD0"0" | VD1"1" VD0"0" | VDR | VDR | VDR |
|  | Read data line 1 (DR1) | — | open | VPC | ~VPC VPC-Δ | 0 |
|  | Source line 1 (SL1) | 0 | 0 | 0 | 0 | 0 |
|  | Word line 1 (WL1) | VW0 | VWW | VW0 | VWR | VW0 |
| Non-selected | Word line 2 (WL2) | VW0 | VW1 | VW0 | VW0 | VW0 |

Table 1 is a voltage table showing voltages to be applied to the memory cells. A write operation writes data to the memory cells driven by the same word line, for example, the memory cells MC1 and MC2. In a data setting step, a voltage VD1 or VD2 representing write information "1" or "0" is applied to the write data line DR1 with the word line WL1 kept at a voltage that keeps the write transistors in a nonconductive state. It is supposed that the read transistor is of an n-type and VD1<VD0. For example, VD1=0 V and VD0=2 V. A pulse voltage of a write voltage VWW of, for example, 3 V is applied to the word line WL1 to turn on the write transistor. The write transistor is made to operate in a nonsaturation region and a current flows until the potential of the charge storage region becomes substantially equal to that of the voltage of the data line DR1. After the application of the write pulse, the higher the set voltage VD0 applied to the data line is, the greater is the amount of charge indicated by a sign, stored in the charge storage region and the lower is the threshold voltage of the read transistor. Therefore, when a precharge voltage VPC of, for example, 1 V is applied to the read data line and a write voltage VWR is applied to the word line for the read operation, the current flowing through the read transistor increases and the potential of the read data line changes quickly from the precharge potential to the source potential of 0 V of the read transistor.

On the other hand, in a state where the threshold voltage is high, a small current which flows through the read transistor and the read data line is kept substantially at the precharge potential. This difference is sensed by a sense amplifier in order to read information from a selected memory cell. When a positive precharge voltage VPC is used, the potential of the read data line is lower when the potential of the write data line is higher (VD0). Therefore, when rewriting the read information, a voltage representing the read information must be loaded on the write data line after inversion. Therefore, a data path is extended from the read data line through an inverter to the write data line. The word line voltage VW1 of the nonselected memory cell in the write operation may be equal to the voltage VW0 for retention. When the word line adjacent to the selected memory cell is set at a lower voltage (VW1<VW0), charge extinction that is attributable to the rise of the potential of the nonselected word line due to capacitive coupling can be prevented.

Second Embodiment

Figure 8A:
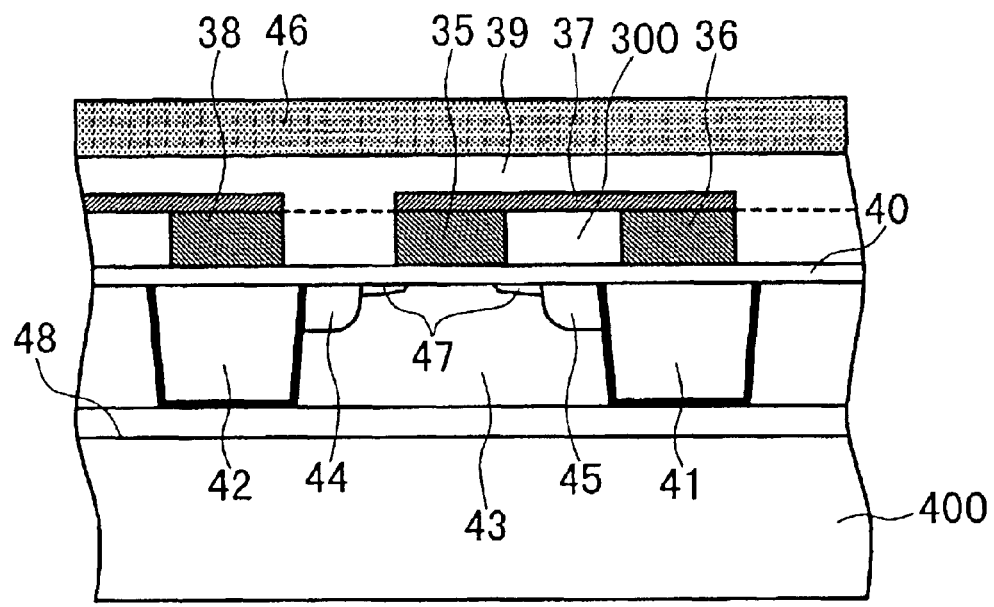
FIGS. 8(a) and 8(b) are views for explaining a method of fabricating the semiconductor memory 10 device in a second embodiment.
Figure 8B:
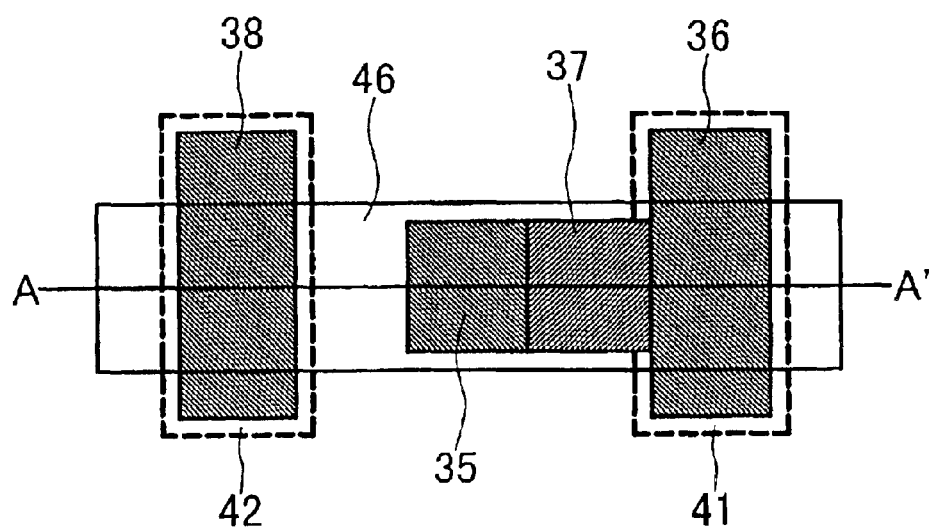

FIG. 8(a) is a typical sectional view of a memory cell included in a semiconductor memory device in the second embodiment according to the present invention, and FIG. 8(b) is a top view of the memory cell shown in FIG. 8(a). The memory cell of the second embodiment is basically the same in configuration as the memory cell of the first embodiment, except that the memory cell of the second embodiment is formed on a SOI substrate (silicon-on-insulator substrate). Hence, the gate electrode of the read transistor of the memory cell of the second embodiment, the method of forming the gate electrode of the read transistor, and the thickness of a film forming the channel of the write transistor of the memory cell of the second embodiment are different from those of the memory cell of the first embodiment. Many processes for fabricating the logic circuit of the second embodiment can be used also for fabricating the memory cells of the second embodiment, and only a few additional processes need to be added to fabricate the memory cells. The leakage current from the write transistor of the memory cell of the second embodiment is less than that from the write transistor of the memory cell of the first embodiment, and the storage device of the second embodiment has an excellent data retention characteristic.

Shown in FIG. 8 is a SOI substrate having a semiconductor substrate 400 and an insulating film 48 formed on the substrate 400. Active regions of a semiconductor device are formed on the SOI substrate. Also shown in FIG. 8 are isolation regions 41 and 42, a semiconductor region 43, deep diffusion layers 44 and 45, 10 shallow diffusion regions 47, an insulating film 40, which also serves as a gate insulating film of one of FET5, regions 35, 36 and 38 for forming drain and source regions, a channel region 37, an insulating film 300, an insulating film 39 and a conductive layer 46. Preferably, the regions 35, 36 and 38 for forming drain and source regions are laminated layers of a metal layer and a polysilicon layer, such as a laminated layer of a W layer and a polysilicon layer. Also, the metal layer is preferably formed on the side of the channel layer. In FIG. 8, each of the laminated layers 35, 36 and 38 is represented by a single layer. These laminated layers can be used in other embodiments.

A method of fabricating the memory cell, and, particularly, steps different from those in the method of fabricating the memory cell of the first embodiment will be described with reference to FIGS. 9 to 12. In FIGS. 9 to 12, components not denoted by any reference characters are the same in geometrical shape as those shown in other drawings.

The SOI substrate has the substrate 400, the buried insulating film 48 formed on the substrate 400, and a predetermined semiconductor layer formed on the buried insulating film 48. A structure fabricated on the semiconductor layer will be described with reference to FIGS. 9 to 12. In most of FIGS. 9 to 12, the insulating substrate is omitted. The relation between the SOI substrate and the structure fabricated on the SOI substrate is shown in FIG. 8.

The isolation regions 41 and 42 are formed in the silicon layer 43 which is formed on the buried insulating film 48, which is then formed on the SOI substrate 400. Then, a gate insulating film 50 and dummy gate parts 49 of $Si_3N_4$ having the shape of a dummy gate electrode are formed. The diffused regions 47 are formed by ion implantation using the dummy gate parts 49. Side walls 51 are formed on the side surfaces of the dummy gate parts 49. The source region 45 and the drain region 44 are formed by ion implantation. Thus, the structure shown in FIG. 8(a) is fabricated. The side walls are formed by a process similar to that by which the side walls of the first embodiment are formed. FIG. 8(b) corresponds to FIG. 1(b). An insulating film 310 is deposited on the thus prepared workpiece, and the insulating film 310 is polished by a CMP process until the upper surfaces of the dummy gates 49 are exposed, as shown in FIG. 9(b).

Figure 9A:
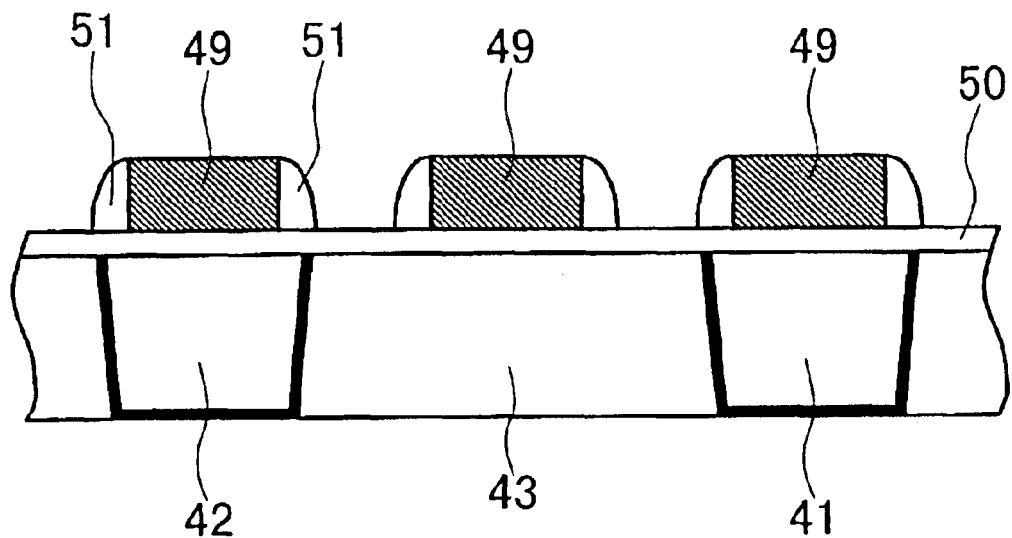
FIGS. 9(a) and 9(b) are sectional views for explaining a method of fabricating a memory cell included in the semiconductor memory device in the second embodiment.
Figure 9B:
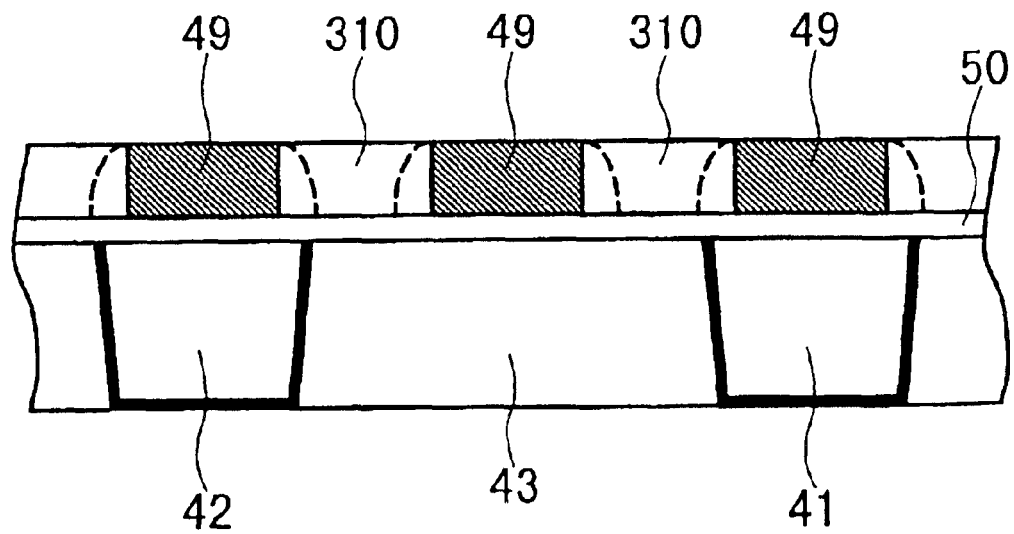
Figure 10A:
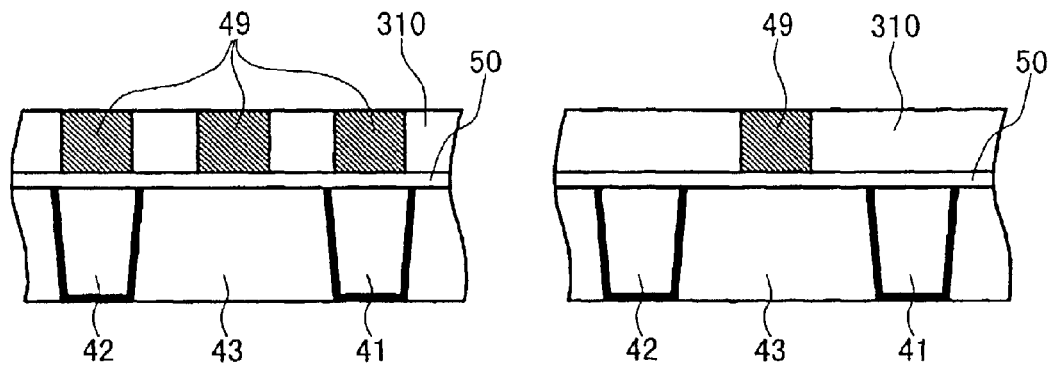
FIGS. 10(a), 10(b) and 10(c) are sectional views for explaining a method of fabricating the semiconductor memory device in the second embodiment.

The state shown in FIG. 10(a) is the same as that shown in FIG. 9(b). In FIG. 10(a), a region for the memory cells and peripheral circuits is shown on the left side and a region for a logic circuit is shown on the right side. In FIGS. 10, 11 and 12, doped regions in the substrate are omitted. Those regions can be well understood from FIG. 9(a).

Figure 14A:
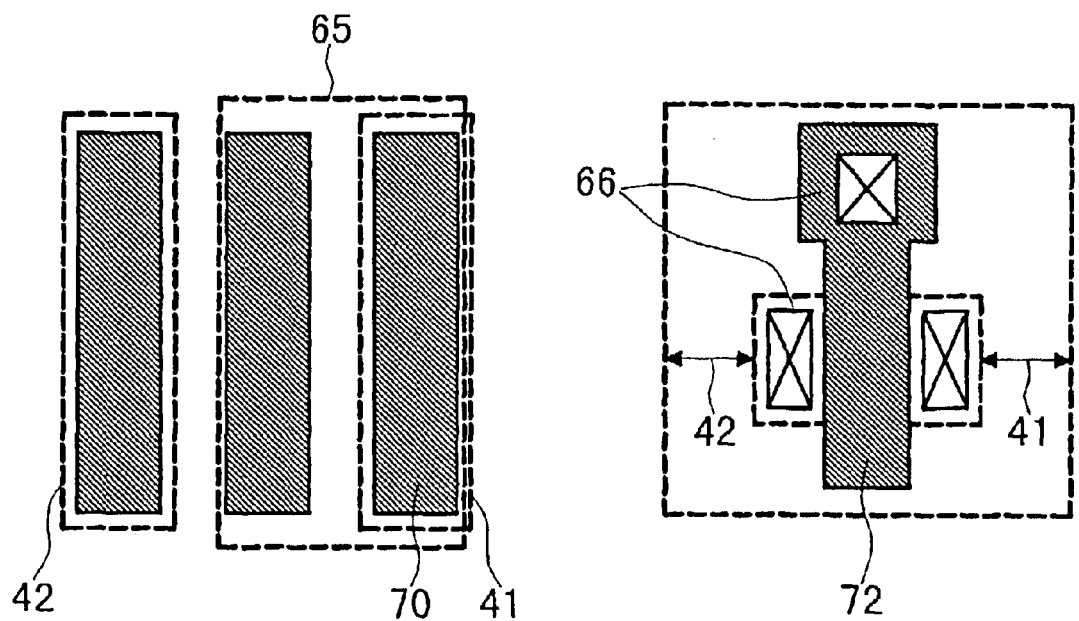
FIGS. 14(a) and 14(b) are top views for explaining a method of fabricating the semiconductor memory device in the second embodiment.
Figure 14B:
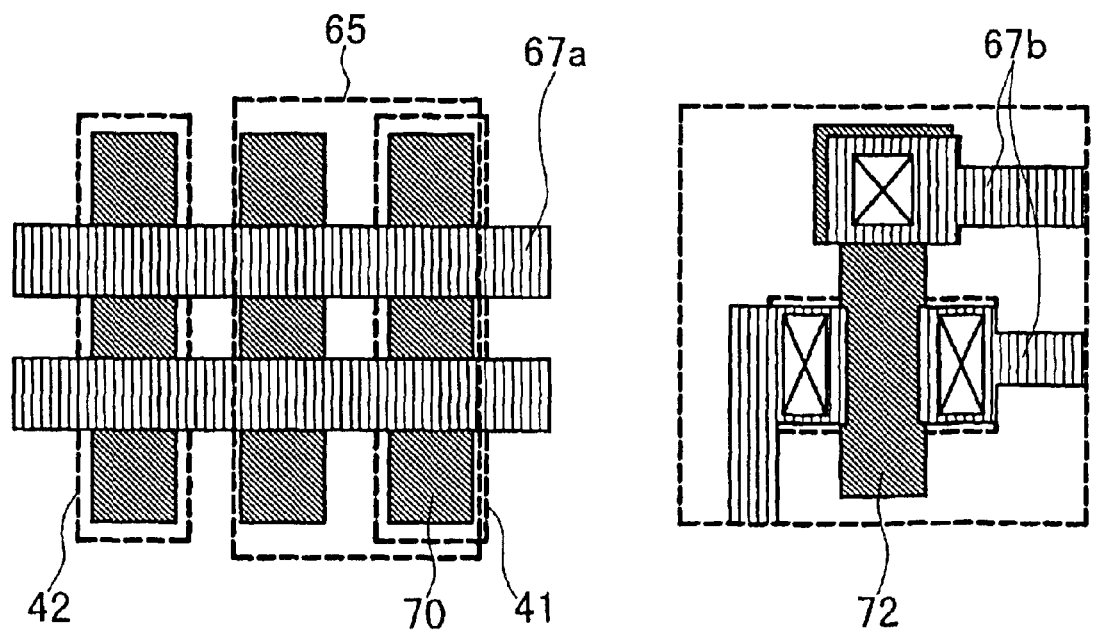
Figure 15A:
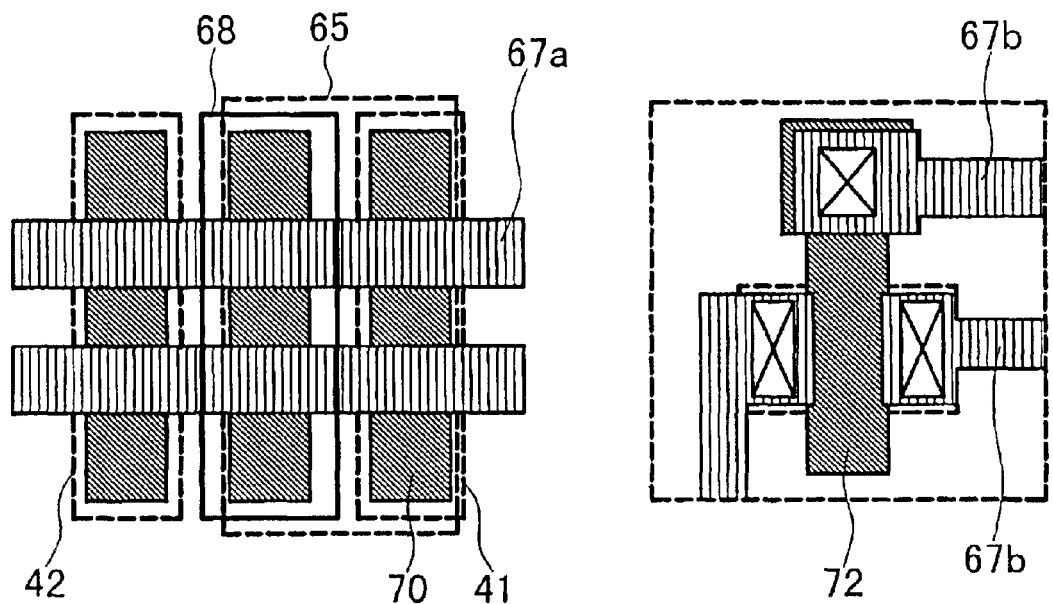
FIGS. 15(a) and 15(b) are top views for explaining a method of fabricating the semiconductor memory device in the second embodiment.
Figure 15B:
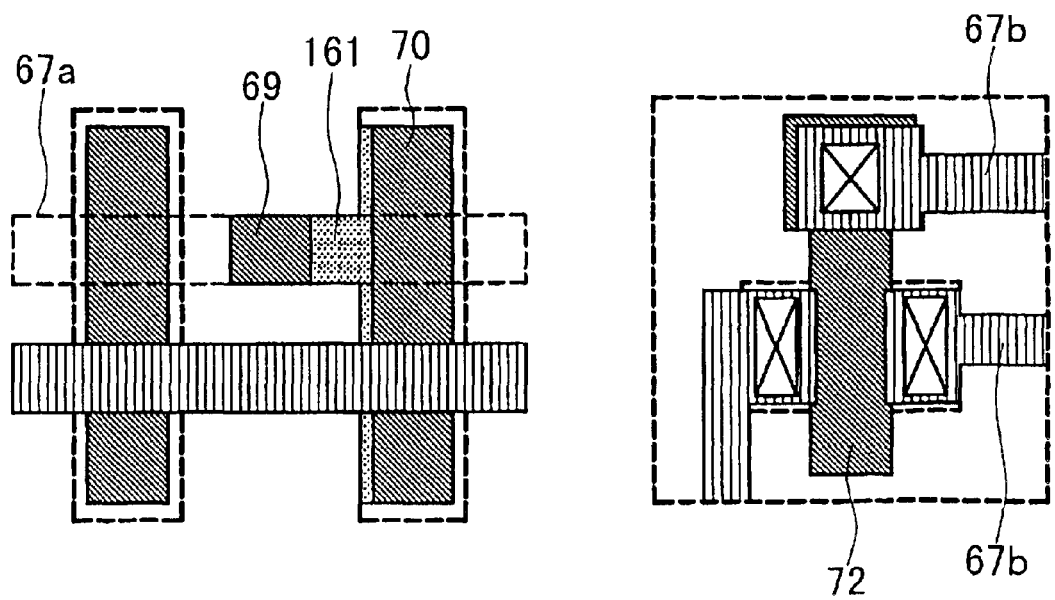
Figure 16:
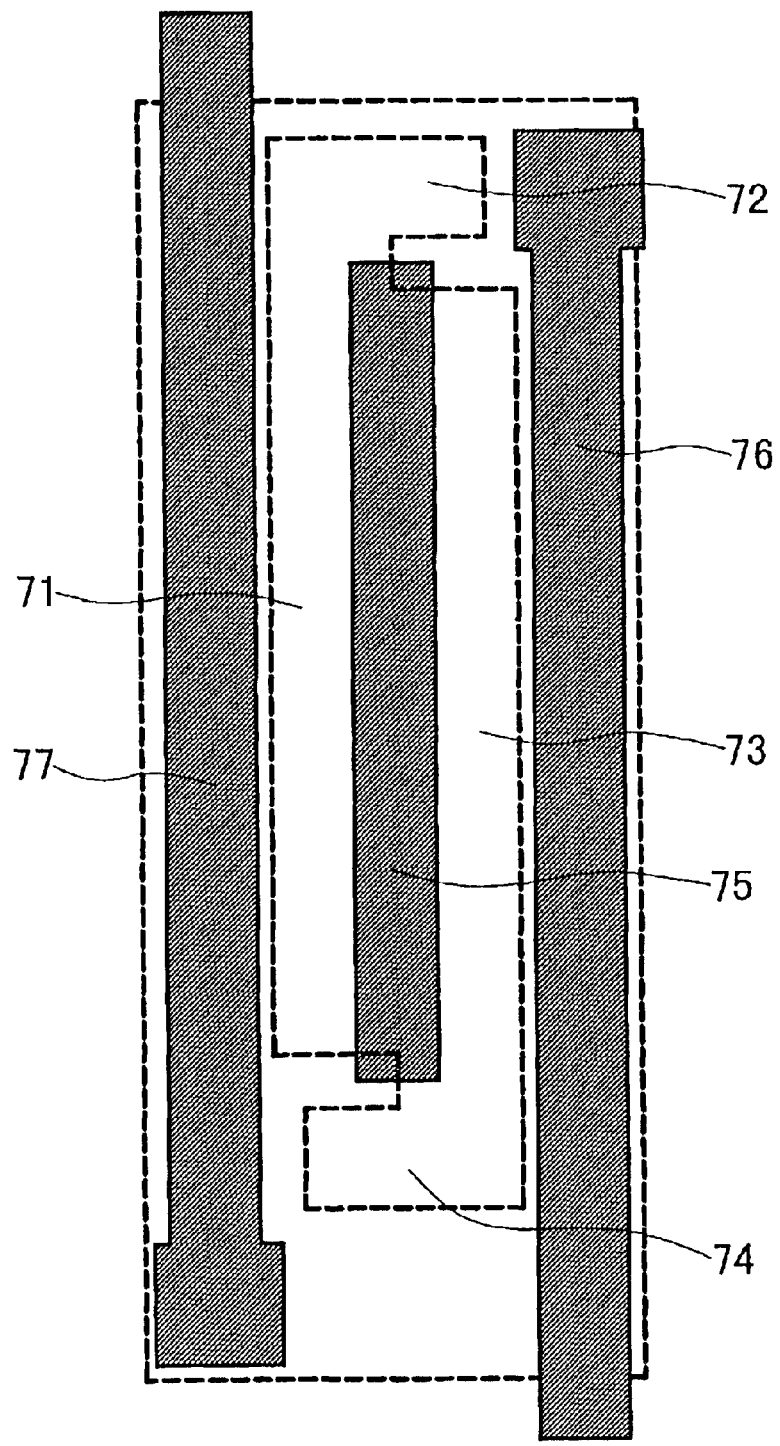
FIG. 16 is a top view for explaining the construction of the memory cell array of the semiconductor memory device in the second embodiment.
Figure 17:
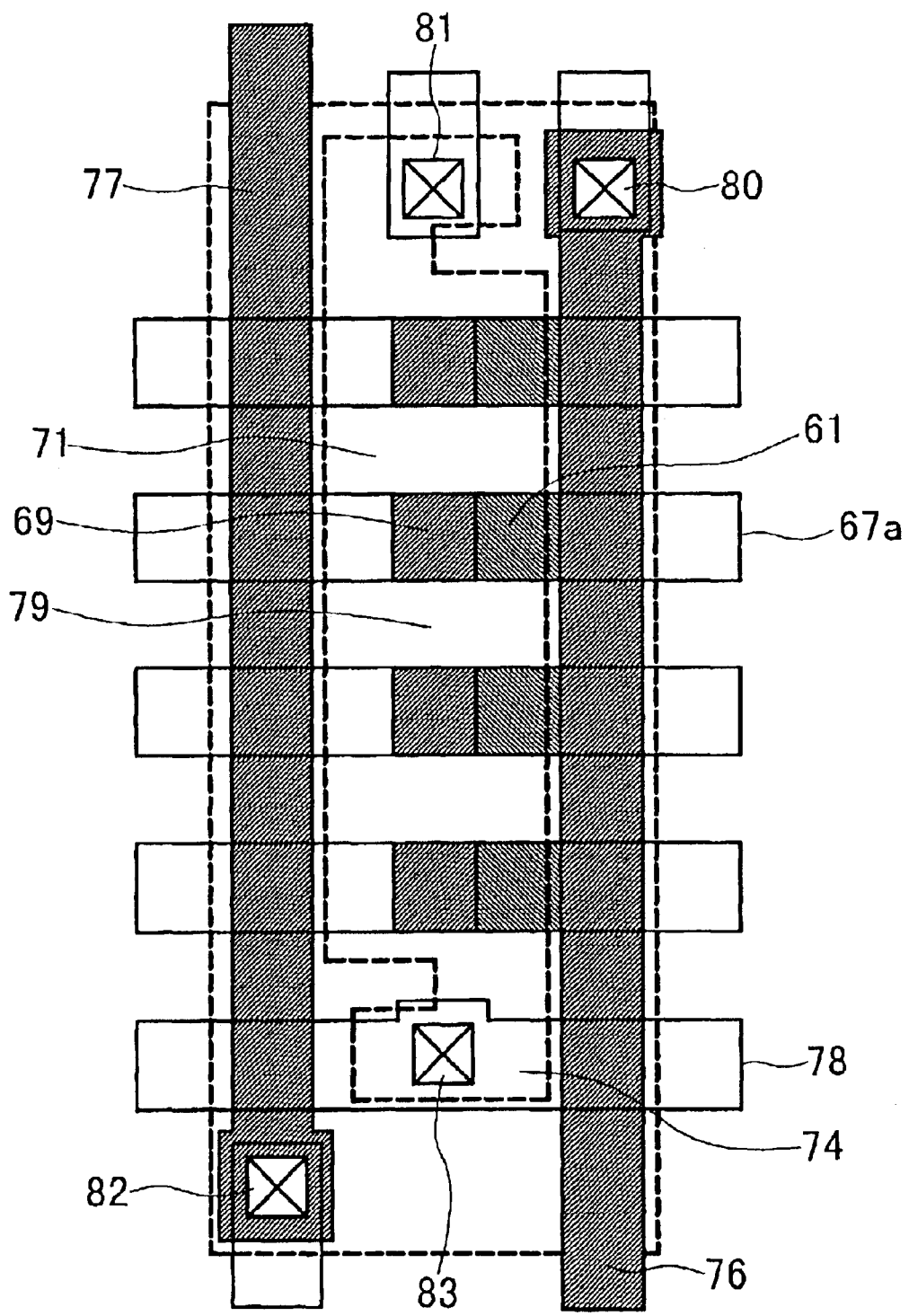
FIG. 17 is a top view for explaining the construction of the memory cell array of the semiconductor memory device in the second embodiment.
Figure 18:
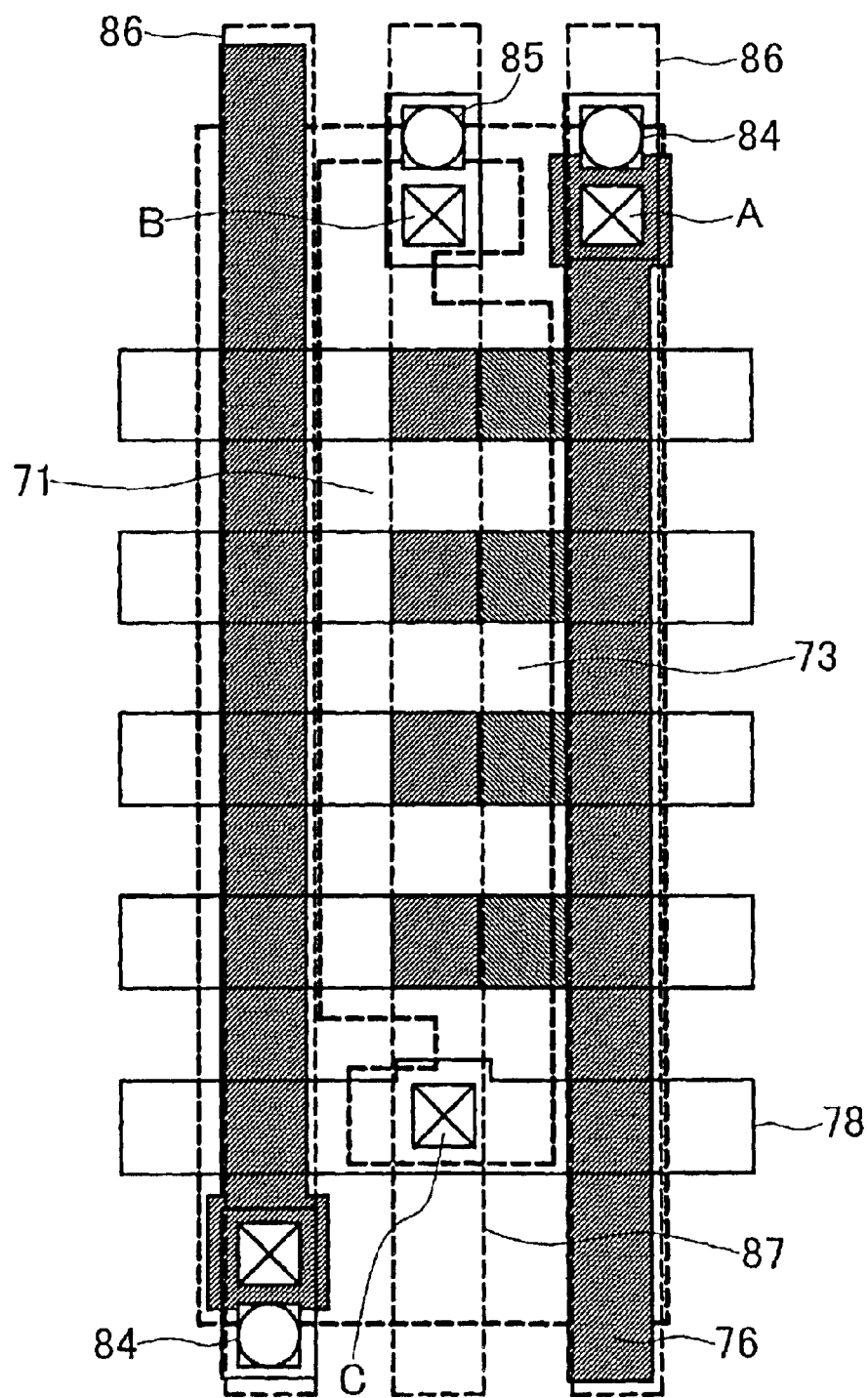
FIG. 18 is a top view for explaining the construction of the memory cell array of the semiconductor memory device in the second embodiment.
Figure 19:
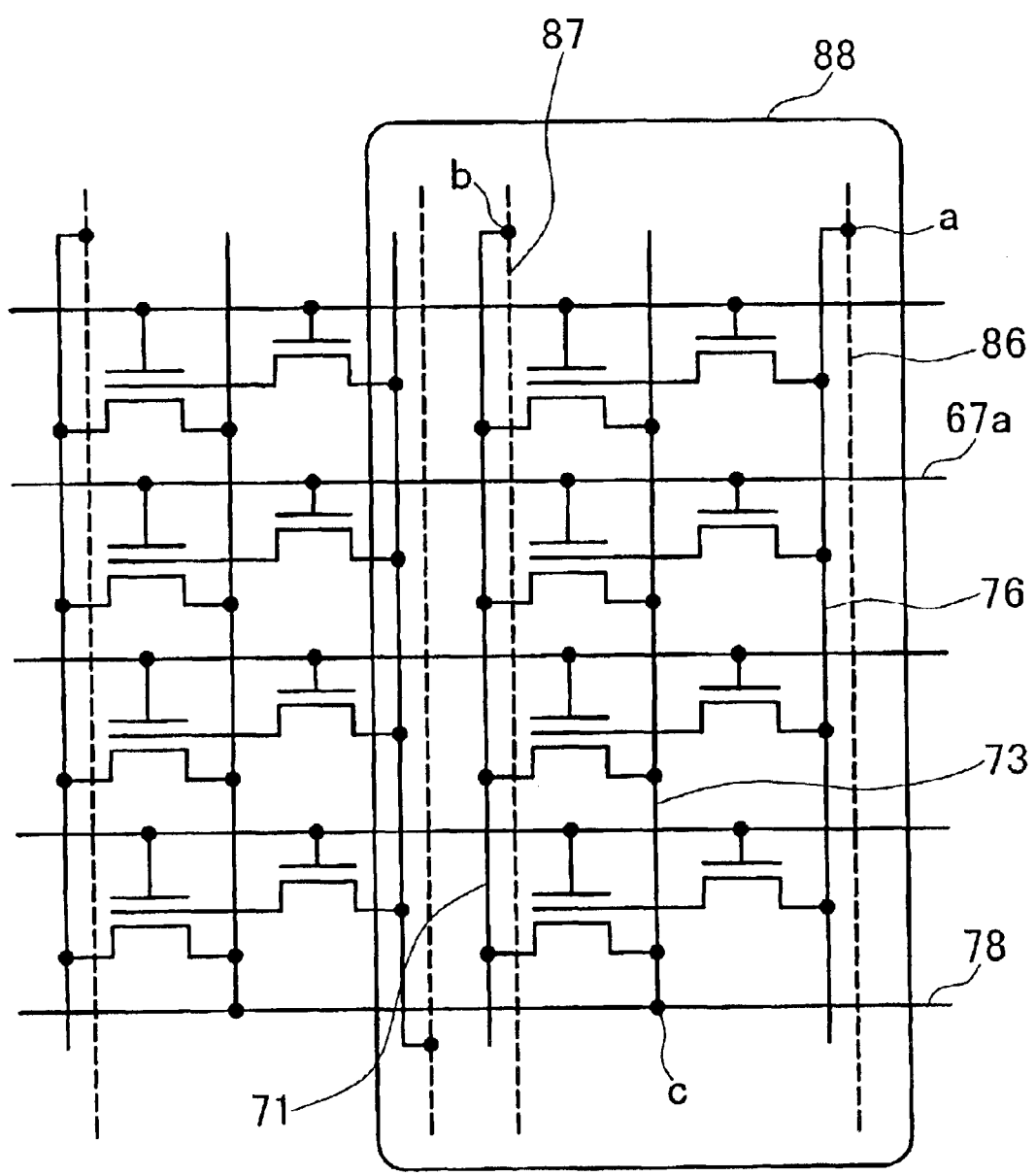
FIG. 19 is an equivalent circuit diagram for explaining the construction of the memory cell array of the semiconductor memory device in the second embodiment.

When a logic circuit part and a memory circuit part are formed on a single substrate, the respective gate insulating films of the logic circuit to which high operating speed is essential, the memory cell unit to which low leakage current is important, and the peripheral circuit which is required to have a withstand voltage on a predetermined level all have different thicknesses, respectively. In FIGS. 10, 11 and 12, the region for the memory cells and the peripheral circuit are shown in sectional views on the left side, and the region for the logic circuit is shown on the right side. In FIGS. 13, 14 and 15, the region for the memory cells and the peripheral circuit are shown in top views on the left side, and the region for the logic circuit is shown on the right side. FIGS. 16 to 19 are views that assist in explaining a method of establishing contact with diffused layers. FIGS. 16 to 18 are top views of four memory cells arranged in a column, and FIG. 19 is a circuit diagram of an equivalent circuit of the four memory cells.

Figure 10B:
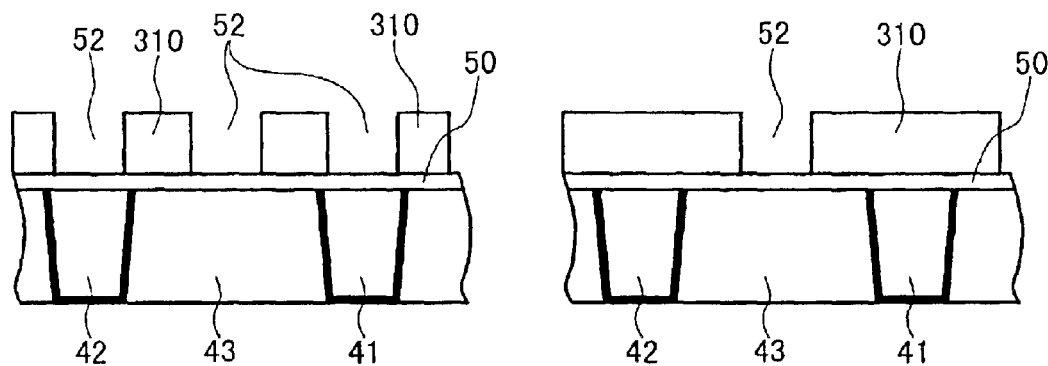
Figure 10C:
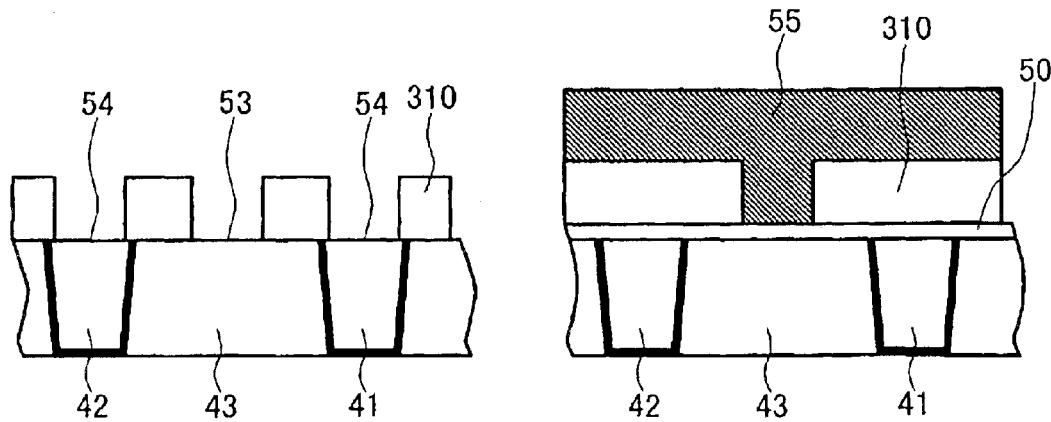

The dummy gates 49 are removed as shown in FIG. 10(b), and a resist film 55 is formed in the region for the logic circuit as shown in FIG. 10(c). Portions of the gate insulating film 50 for the read transistors of the memory cells and the transistors of the peripheral circuit are removed by etching, using the resist film 55 as a mask, as shown in FIG. 10(c). Portions for the storage nodes of the memory cells and the gates of the MOS transistors of the peripheral circuit in the surface 53 of the semiconductor region 43 are exposed, while isolation regions are exposed in portions in which write data lines are to be formed.

Figure 11A:
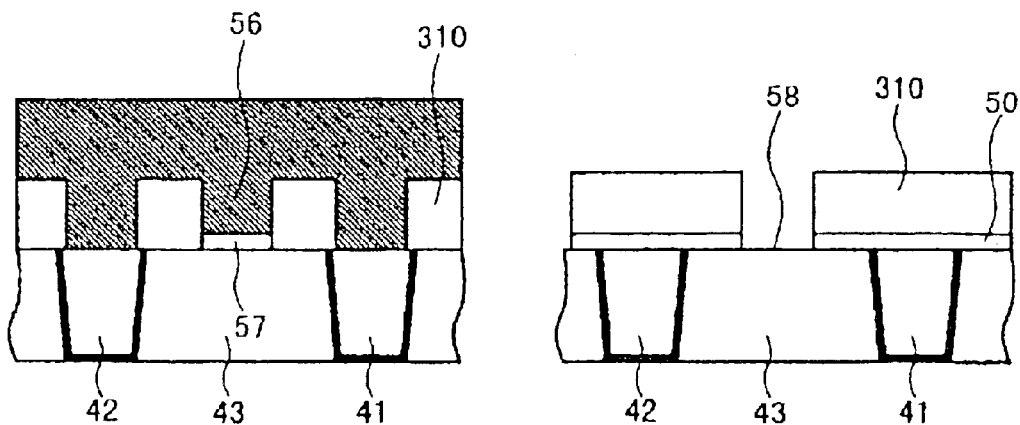
FIGS. 11(a), 11(b) and 11(c) are sectional views for explaining a method of fabricating the semiconductor memory device in the second embodiment.

Another gate insulating film 57 for the peripheral circuit is formed and a resist film 56 is formed, over the region for the peripheral circuit. Dummy gate insulating film corresponding to a portion 58 for the transistors of the logic circuit is removed as shown in FIG. 11(a).

Figure 11B:
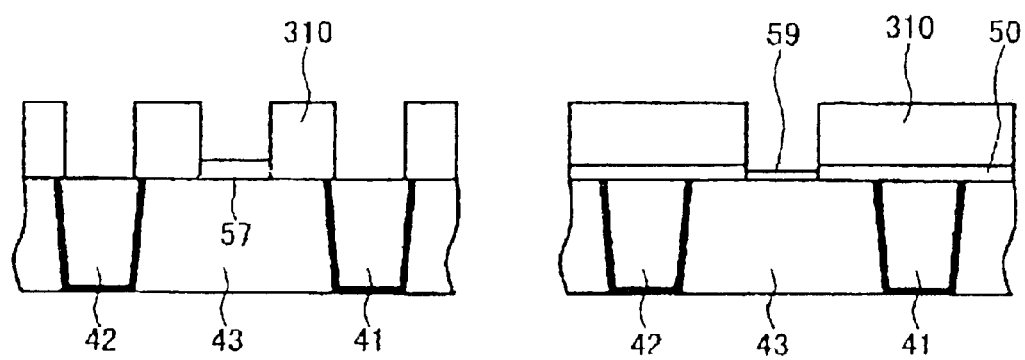
Figure 11C:
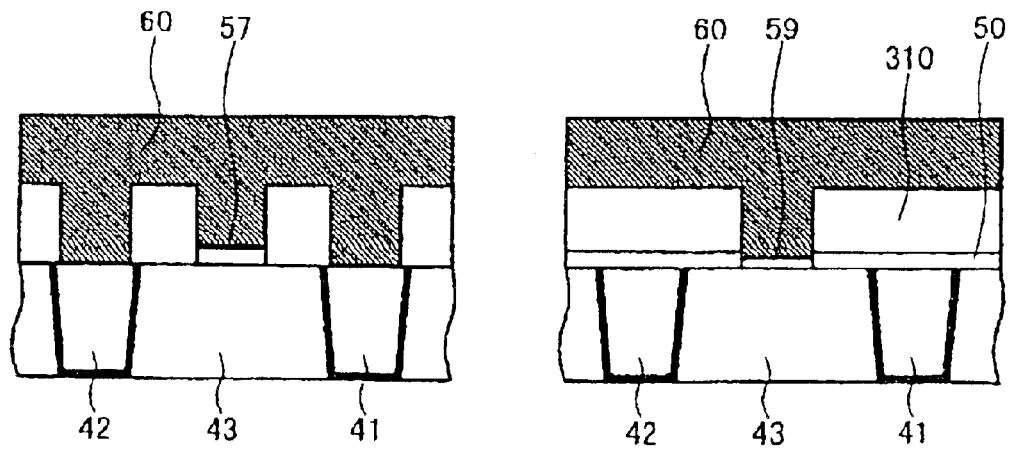
Figure 12A:
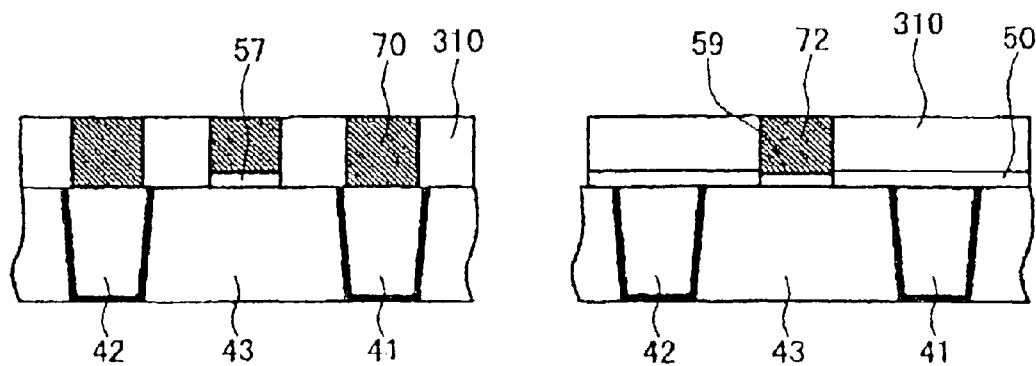
FIGS. 12(a), 12(b) and 12(c) are sectional views for explaining a method of fabricating the semiconductor memory device in the second embodiment.
Figure 12B:
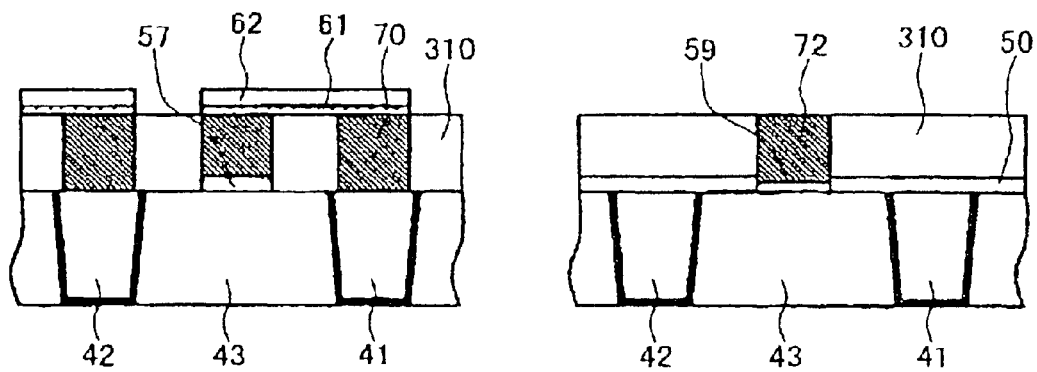
Figure 13A:
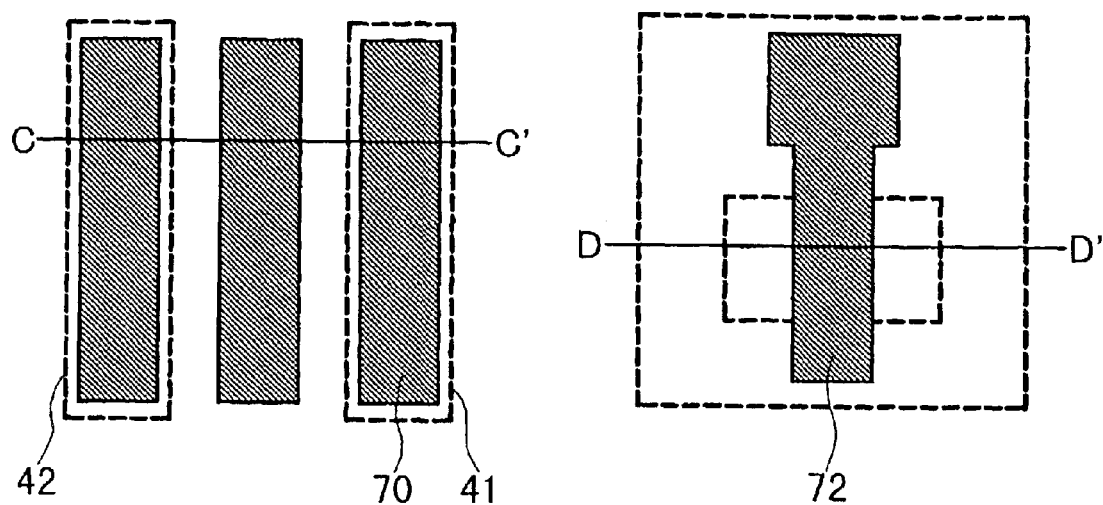
FIGS. 13(a) and 13(b) are top views for explaining a method of fabricating the semiconductor memory device in the second embodiment.
Figure 13B:
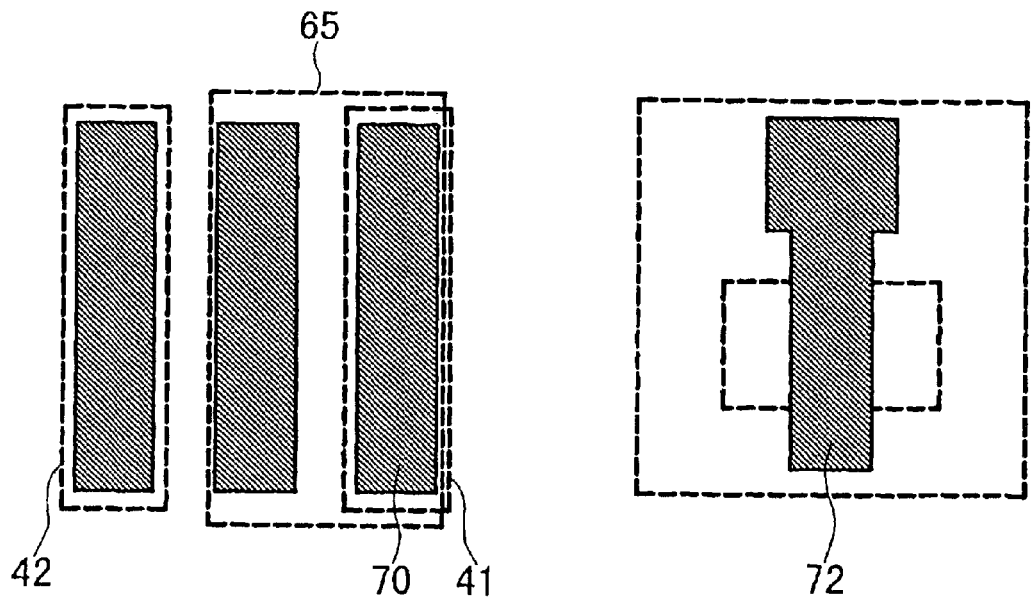

A gate insulating film 59 for the transistors of the logic circuit, as shown in FIG. 11(b), and then a metal film 60, such as a W film, are deposited on the thus constructed workpiece, as shown in FIG. 11(c). Then, the metal film is subjected to a CMP process to form gate electrodes in portions corresponding to grooves in which dummy gates were formed, as shown in FIG. 12(a). The write data line 70 for the memory cells and a gate electrode 72 for the transistors of the logic circuit and the peripheral circuit are also formed by the CMP process, as shown in FIG. 13(a), in which the gate electrode is formed on the left side of the data line 70. FIG. 12(a) is a sectional view taken on line C–C' in FIG. 13(a), and FIG. 12(b) is a sectional view taken on line D–D' in FIG. 13(b).

FIG. 16 is a plan view of a region 74 in which contact holes for a diffused layer 73 for the sources of the read transistors are formed, and a region 72 in which contact holes for a diffused wiring line 71 for the drains of the read transistors are formed. A write data line 76 which is formed in the gate electrode layer and a line 75 that is parallel to the adjacent line 77 are processed later to form charge storage regions.

A very thin amorphous silicon film (a-Si film) 61 of 20 a thickness on the order of 3 nm is deposited to form the channels of the write transistors, and then a 10 nm thick $SiO_2$ film 62 is deposited. Then, as shown in FIG. 12(b) the $SiO_2$ film 62 and the a-Si film 61 are etched by an etching process using a mask 65, shown in FIG. 13(b), which is formed by patterning a resist film.

The mask 65 does not cover the regions for the logic circuit and the peripheral circuit. Therefore, portions of the $SiO_2$ film 62 and the a-Si film 61 covering those uncovered regions are etched off. Leakage current in the second embodiment, similarly to that in the first embodiment, is small. In the second embodiment, potential in the film increases owing to quantum-mechanical confinement energy, which further reduces leakage current. In regions where the film is thin, even a slight change in the thickness can cause a potential change, and, hence, potential distribution in the film is not uniform and varies randomly. Even if the film has a plurality of low-potential parts in a nonconductive state, the low-potential parts are divided by high-potential parts, and the grain boundaries of the polysilicon film function as potential barriers. Consequently, leakage current is reduced.

A gate insulating film for the write transistors is formed, and the diffused layers for the transistors of the logic circuit and the peripheral circuit, the contact holes for gates, the diffused layers for the read transistors of the memory cells, the write data lines, the read data lines, and the contact holes 66 for the source lines are formed by using resist masks. FIG. 14(a) shows the arrangement of the contact holes 66, the isolation regions 41 and 42, and a region 72 in which the contact holes are formed.

Figure 12C:
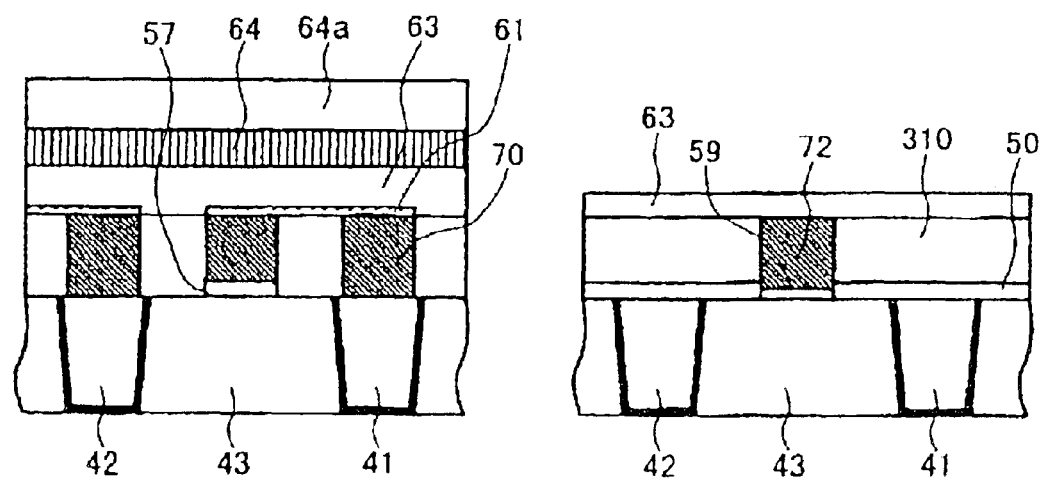

After removing the resist mask, a metal film 64 is deposited so as to fill up the contact holes and an insulating film 64a is formed over the metal film 64. The insulating film 64a and the metal film 64 are processed by using a mask which is formed by patterning a resist film to form word lines 67a for the memory cell array and wiring lines 67b for the logic circuit and the peripheral circuit. Source lines for the memory cell array are formed in this layer, as shown in FIG. 12(c). Patterns thus formed are shown in FIG. 14(b).

Subsequently, an etching process using a patterned photoresist film as a mask for forming a hole pattern 68 and using the word lines 67a of the memory cells as a mask is performed to form charge storage parts 69 and the channels 161 of the write transistors. In FIG. 15(b), the word lines 67a are indicated by broken lines because the patterns of the word lines 67a, channels and the charge storage regions overlap each other in a self-alignment process. Since the regions for the logic circuit and the peripheral circuit are masked, they are not etched.

FIG. 17 is a plan view of a first wiring layer in the semiconductor memory device. A contact 83 for a diffused layer 73 for the source region of the read transistor and a contact 81 for the diffused wiring line 71 for the drain region of the read transistor are shown in FIG. 17. The contact 81 for a write data line 77 for the adjacent column is shifted along the write data line relative to a contact 80 for a write data line 76, and, hence, pitches along the column are small. A source line 78 is extended parallel to the word line to connect the columns.

A separation region 79 for forming a charge storage region is formed in a sufficiently high dose to reduce the current leakage between the diffused layer 73 for the source region of the read transistor and the diffused wiring line 71 for the drain region of the read transistor to a satisfactorily low level. When necessary, impurity ion implantation may be performed at this stage to raise the threshold voltage of the separation region 79.

Figure 27:
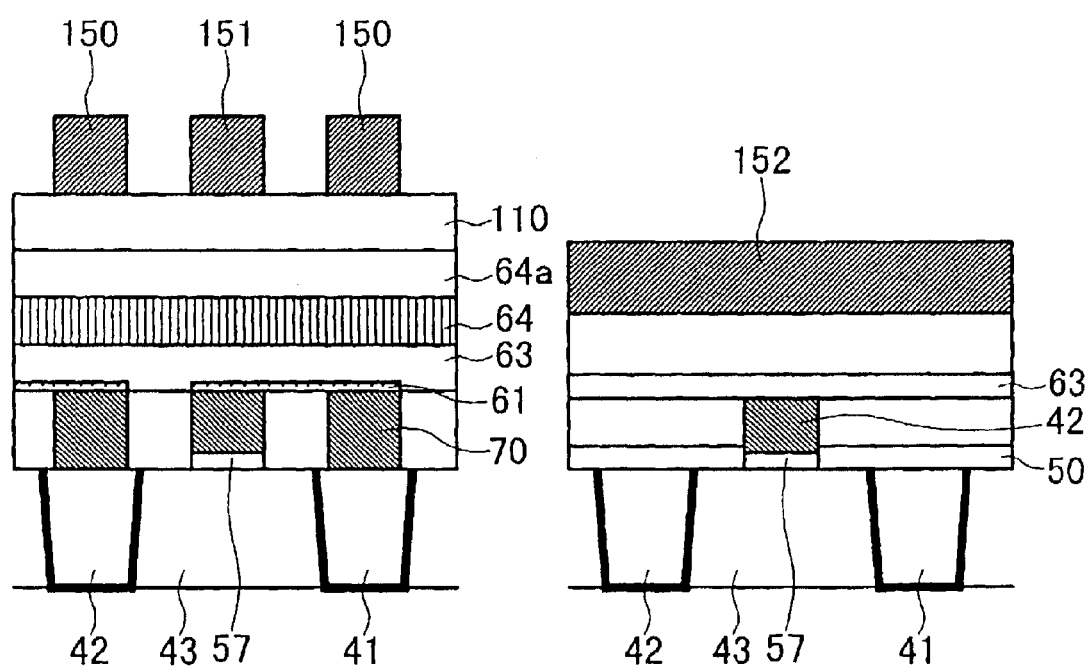
FIG. 27 is a sectional view for explaining a method of fabricating the semiconductor memory device in the fourth embodiment.
Figure 28A:
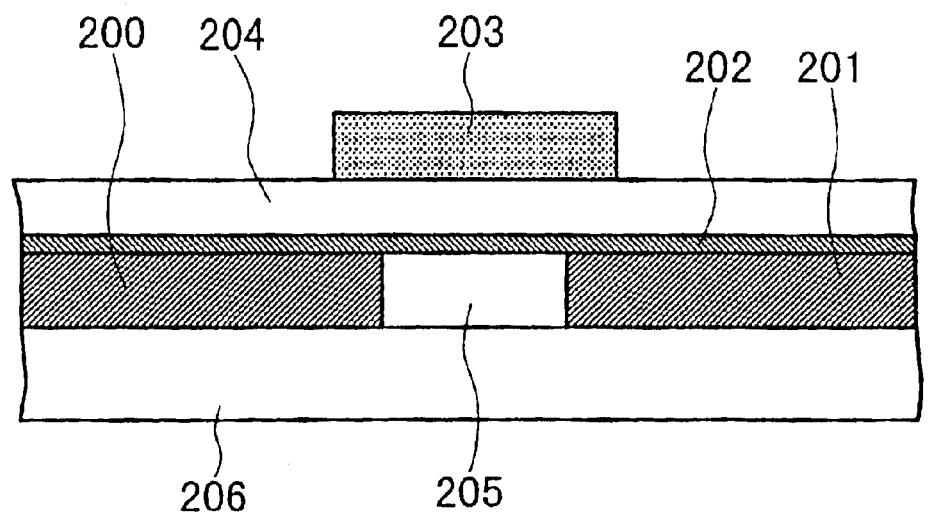
FIGS. 28(a) and 28(b) are views for explaining the basic composition of a transistor included in a semiconductor memory device in a fifth embodiment according to the present invention.
Figure 28B:
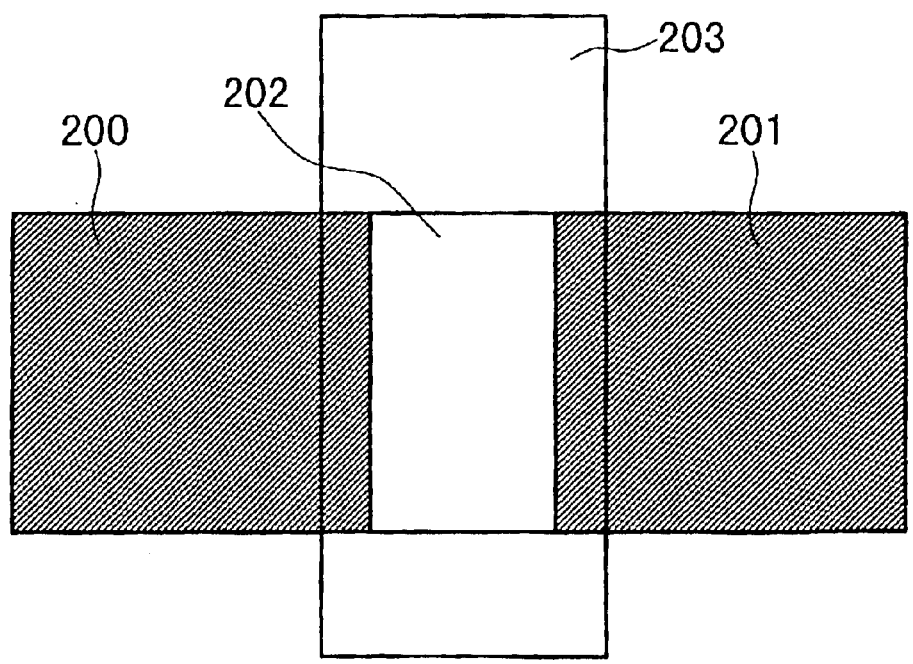

Subsequently, an insulating film is deposited and flattened. This insulating film serves as a layer of insulating film between the first wiring layer and a second wiring layer. Then, as shown in FIG. 18, through holes 84 and 85 are formed by using a mask formed by patterning a resist film. Then, a conductive film of a conductive material, such as a metal, is deposited over the insulating film so as to fill up the through holes 84 and 85, and the conductive film is processed by using a mask formed by patterning a resist film to form wiring lines of the second wiring layer. The conductive material filling up the through holes interconnects the first and the second wiring layer. The write data lines 86 and the read data lines 87 are wiring lines formed in the second wiring layer. The diffused wiring line 71 of the semiconductor base is used as a read data line. The diffused wiring line 71 is thin and narrow, and, hence, has a high resistance. Therefore, in the second embodiment, the diffused wiring line 71 is lined with a metal wiring line to form a laminated wiring line having a low resistance. FIG. 18 is a plan view of the second wiring layer of the semiconductor memory device, and FIG. 27 is a sectional view of the memory cell of the same semiconductor memory device. In the second wiring layer, write data lines 150 and a read data line 151 are extended parallel to each other. Although a wiring line 153 is shown in a sectional view of a logic circuit part shown on the right side in FIG. 27, the shape of the section is dependent on a wiring pattern. Although a similar wiring line 86 is formed for the write data line 76 in the second embodiment, the wiring line 86 may be omitted and only wiring lines of the gate electrode layer may be used to arrange the data lines of the second wiring layer at increased pitches and to form the memory cell array in a smaller area (FIG. 18). As shown in FIG. 28, when the write data lines 151 are omitted, the width and pitches of the read data line 151 can be increased accordingly.

FIG. 19 is a circuit diagram of an equivalent circuit at this stage. In FIG. 19, a part 88 surrounded by continuous lines corresponds to the part shown in FIGS. 16 to 18. Parts A, B and C shown in FIG. 18 correspond to parts a, b and c, respectively. Processes for depositing and flattening an insulating film, forming through holes in the insulating film, and depositing and processing a metal film are repeated to form a third and other wiring layers.

Figure 20:
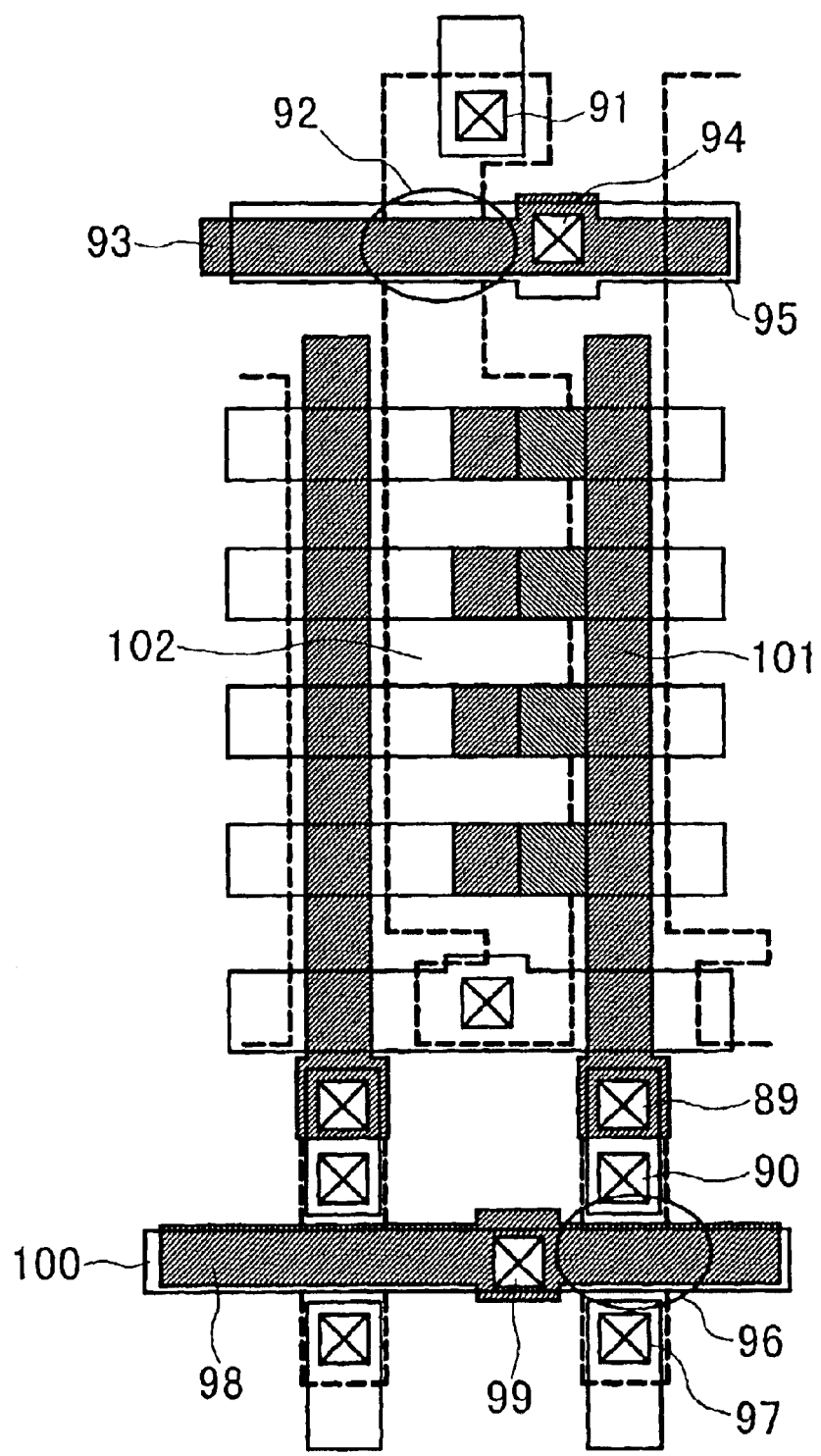
FIG. 20 is a top view for explaining the construction of the memory cell array of a semiconductor memory device in a modification of the semiconductor memory device in the second embodiment.
Figure 21:
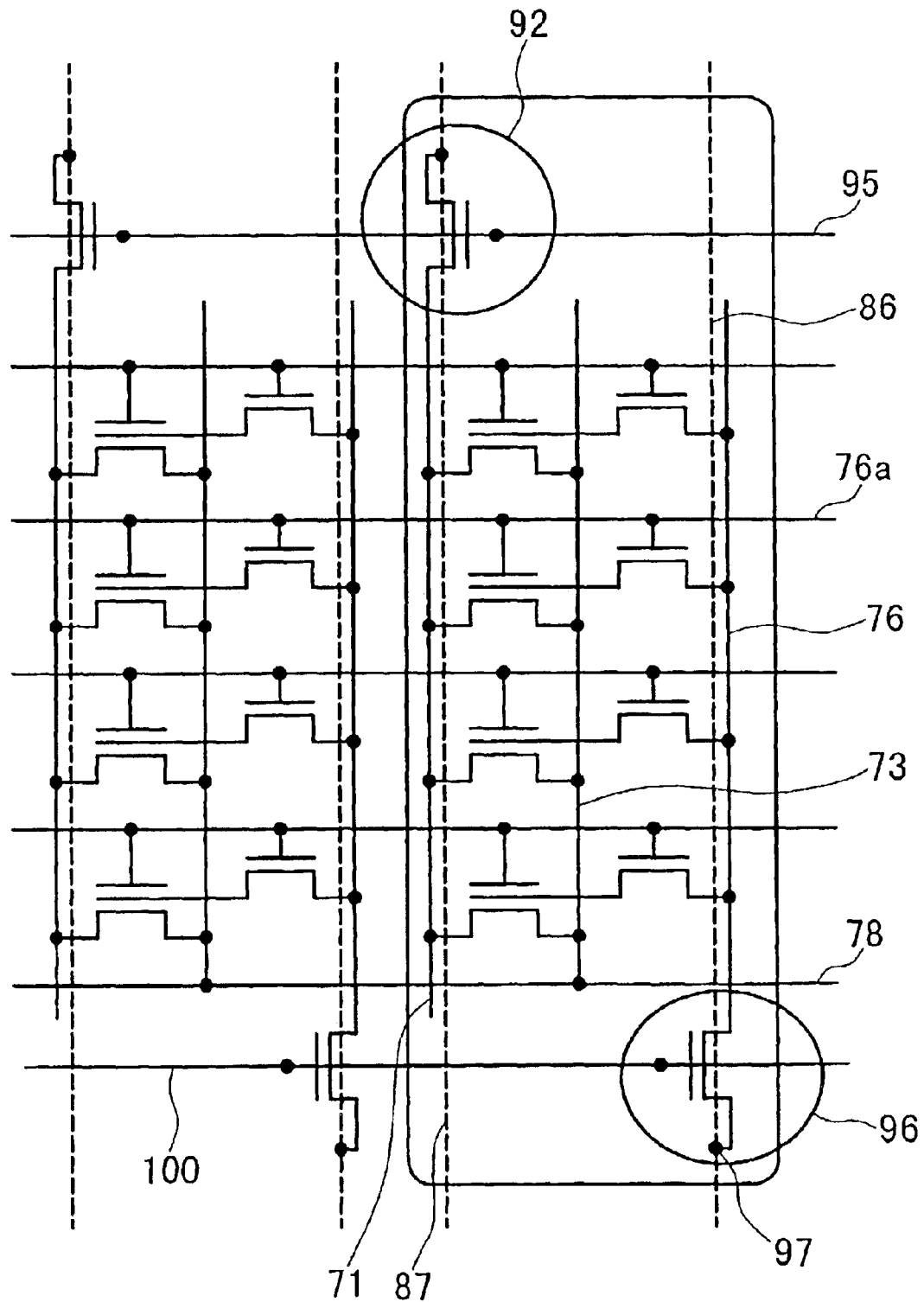
FIG. 21 is a circuit diagram for explaining the construction of the memory cell array shown in FIG. 20.

FIGS. 20 and 21 show a modification of the semiconductor memory device in the second embodiment. FIG. 20 is a top view for explaining the construction of the memory cell array of the semiconductor memory device, and FIG. 21 is a circuit diagram for explaining the construction of the memory cell array of the same semiconductor memory device. FIGS. 20 and 21 correspond to FIGS. 17 and 19, respectively. This modification differs from the second embodiment in the employment of a selecting transistor 96 for a write data line 101, and a selecting transistor 92 for a read data line 102. Data lines are organized hierarchically to drive small-scale units of memory cells selectively instead of driving the memory cell array. Thus, capacity is reduced, operating speed is enhanced, and power consumption is reduced. The write data line (local write data line) 101 is connected through the selection transistor and a contact hole 91 to a global data line. The global data line corresponds to the data lines 86 and 87 of the second embodiment. Wiring lines 95 and 100 for driving the selection transistors for the local data lines are extended parallel to the word line.

Third Embodiment

In the first and second embodiments, the drain regions of the plurality of read transistors are connected by the diffused layer. In the third embodiment, memory cells are connected to contacts 113, respectively, and the contacts 113 are connected to a read data line 109, included in an upper wiring layer. The two memory cells share the one contact 113. Although the area of a region in which memory cells are arranged is small when a diffused layer is used, source lines 114 having a small parasitic resistance and permitting quick access are connected by a diffused layer and are extended parallel to word lines 106.

Figure 22A:
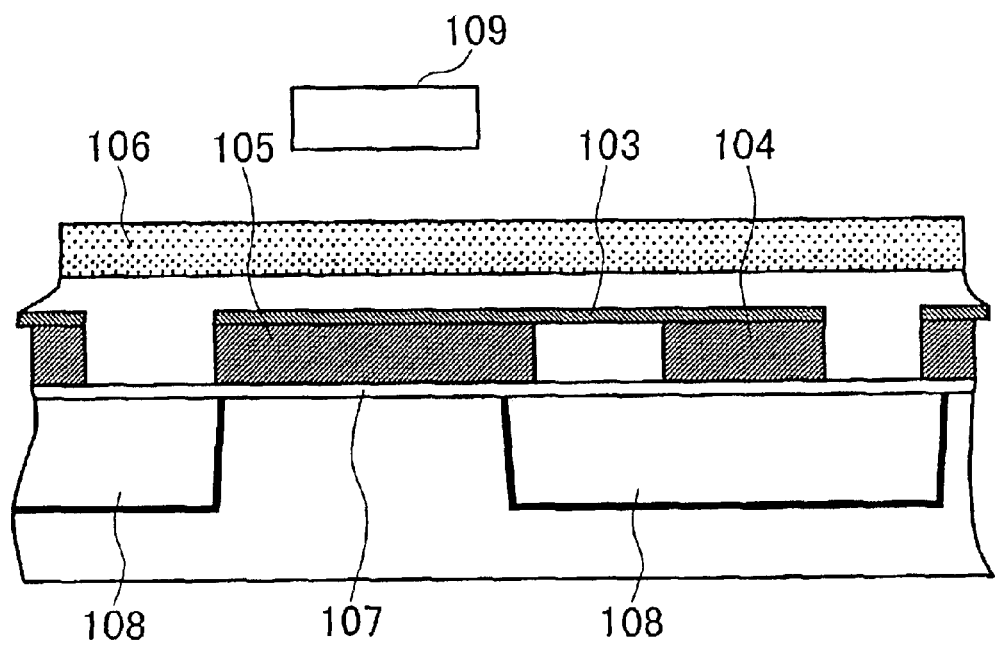
FIGS. 22(a) and 22(b) are typical sectional views of a semiconductor memory device in a third embodiment according to the present invention in different phases of the semiconductor memory device fabricating process.
Figure 22B:
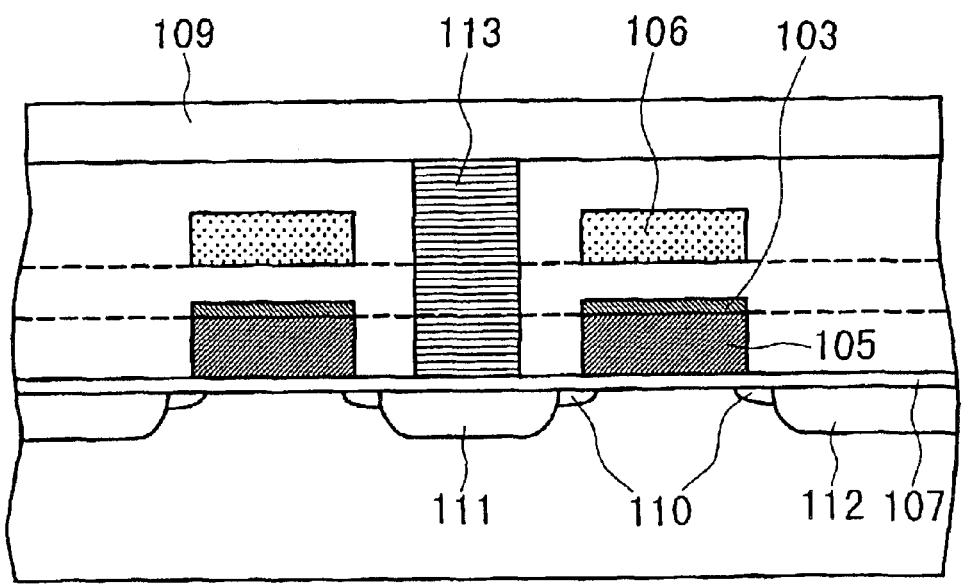
Figure 23:
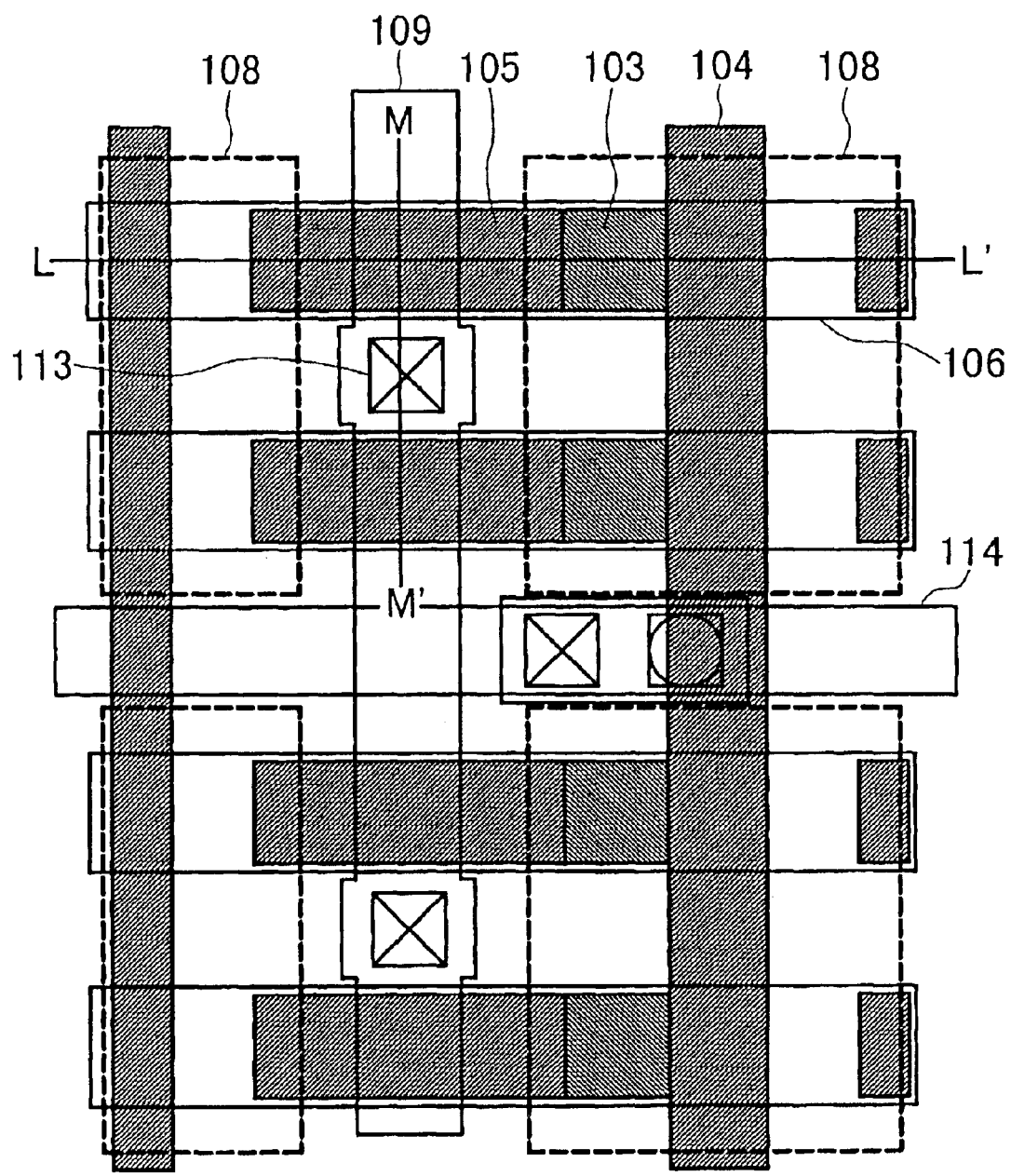
FIG. 23 is a top view of the memory cell array of the semiconductor memory device in the third embodiment.
Figure 24:
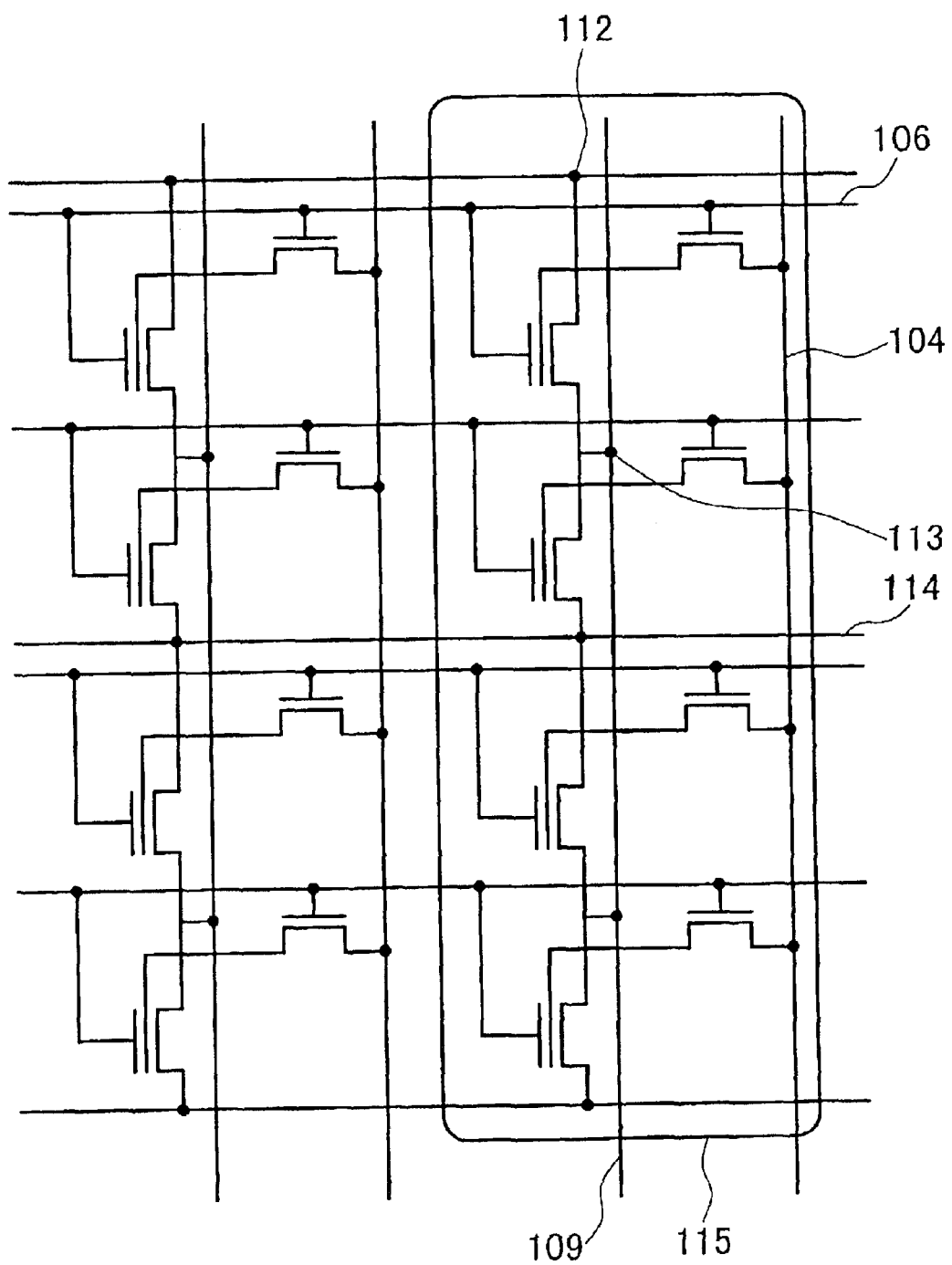
FIG. 24 is a circuit diagram of an equivalent circuit of the memory cell array of the semiconductor memory device in the third embodiment.

FIGS. 22 to 24 are views for explaining the third embodiment. FIGS. 22(a) and 22(b) are typical sectional views, FIG. 23 is a top view of the memory cell array of the third embodiment, and FIG. 24 is a circuit diagram of an equivalent circuit of the memory cell array of the third embodiment. FIG. 22(a) is a sectional view taken on line L–L' in FIG. 23, and FIG. 22(b) is a sectional view taken on line M–M' in FIG. 23. FIG. 23 shows a part 115 enclosed by the continuous lines shown in FIG. 24.

A read transistor has a source 112 and a drain 111. The drain 111 is connected through a contact 113 to a read data line 109 formed in an upper wiring layer. The contact 113 is connected to the doped regions of the two transistors. This state can be understood from the circuit diagram shown in FIG. 24. A charge storage region 105 for a write transistor is formed on an insulating film 107, and a word line 106 is formed on another insulating film.

Referring to FIG. 22(a), isolating regions 108 are formed in a semiconductor substrate. FETs having channels of a polysilicon thin film are formed on the isolating regions 108. Doped regions 104 and 105 underlie a polysilicon thin film 103. Word lines 106 are formed on an insulating film covering, the polysilicon thin film 103. The polysilicon thin film 103 forms the channel regions of the transistors. A read data line 109 is formed in an upper wiring layer mentioned in connection with FIG. 22(*b*). The read data line 109 is connected through a contact 113 to a doped semiconductor region.

The operating principle of the memory cells of the third embodiment is the same as that of the memory cells of the first and second embodiments. A set voltage for the write data line is changed according to information to be written and a voltage is applied to the word line 106 to store a charge in the charge storage region 105. This is read in a change in the threshold voltage of the read transistor including the word line 106, the source 112 and the drain 111.

Fourth Embodiment

The fourth embodiment of the present invention is driven by a different driving method. The fourth embodiment is the same in cell configuration and memory cell array construction as the second embodiment. Table 2 shows voltages applied to the write data line, the read data line, the source line and the word line of the fourth embodiment for writing and reading.

voltages for (1, 1) and (0, 0). Consequently, it is possible to decide whether it is (0, 1) or (1, 1), or whether it is (0, 0) or (1, 0). The result is stored in a register, and word line voltages are set to VWR2 and VWR3 for the second cycle of read operation. It is possible to decide whether it is (0, 1) or (0, 0), or whether it is (1, 1) or (1, 0) by the second cycle of read operation. Thus, a logic operation is performed by the result of the first cycle of the reading operation to provide read information.

Figure 26:
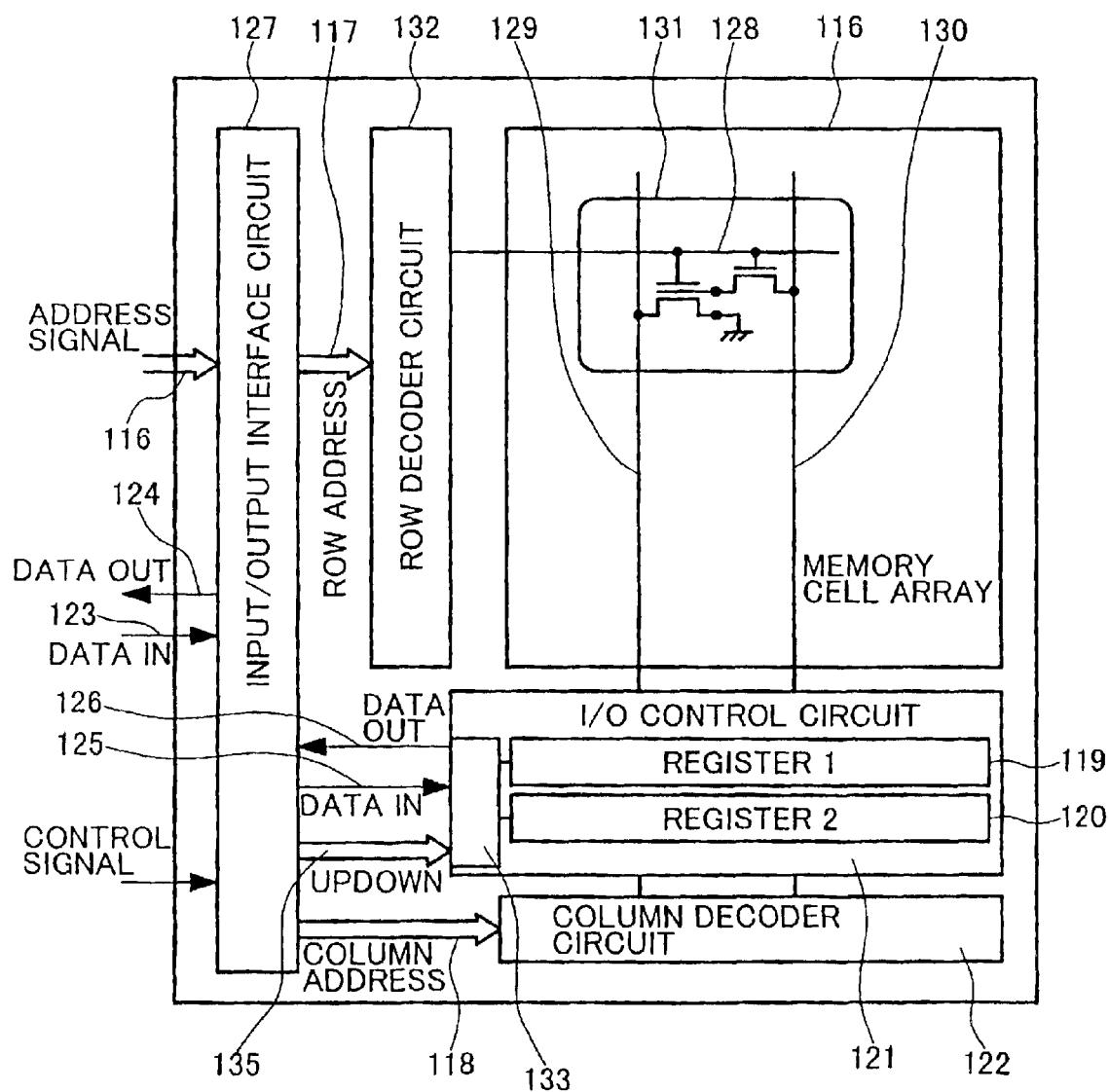
FIG. 26 is a block diagram of a memory and peripheral circuits included in the semiconductor memory device in the fourth embodiment.

The configuration of a memory circuit in the fourth embodiment and the operation of the memory circuit will be described. FIG. 26 shows the memory circuit and a peripheral circuit.

A read operation for reading information from the memory circuit will now be explained. An I/O interface generates a row address 117, a column address 118, and a high-order/low-order bit selection signal 135 for a requested address signal 116. Two-bit information is stored in a memory cell specified by the given row address 117 and the given column address 118. This is stored in registers 1 and 2 by the aforesaid read procedure. Subsequently, an up/down change circuit 133 performs selection according to the

TABLE 2

|  |  | Write | | Read 1 | | Read 2 | |
|---|---|---|---|---|---|---|---|
|  |  | Data set | Write | Pre-charge | Read | Pre-charge | Read |
| Selected | Write data line 1 (DW1) | VD1(0,1) VD2(1,1) VD3(0,0) VD4(1,0) | VD1(0,1) VD2(1,1) VD3(0,0) VD4(1,0) | VDR | VDR | VDR | VDR |
|  | Read data line 1 (DR1) | — | Open | VPC | VPC-Δ' VPC-Δ ~VPC ~VPC | VPC | VPC-Δ ~VPC VPC-Δ ~VPC |
|  | Source line 1 (SL1) | 0 | 0 | 0 | 0 | 0 | 0 |
|  | Word line 1 (WL1) | VW0 | VWW | VW0 | VWR1 | VW0 | VWR2 VWR3 |
| Non-selected | Word line 2 (WL2) | VW0 | VW1 | VW0 | VW0 | VW0 | VW0 |

Figure 25:
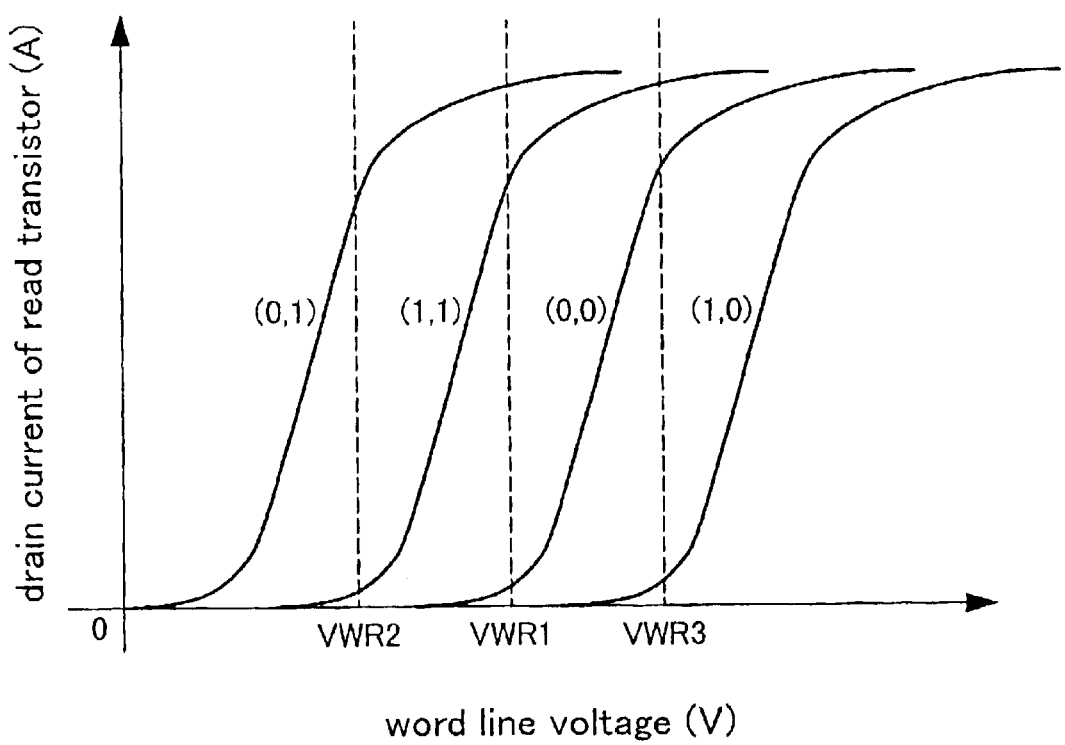
FIG. 25 is a graph showing the current-voltage characteristic in a storage state of a memory cell included in a semiconductor memory device in a fourth embodiment is according to the present invention.

The fourth embodiment stores two bits in one memory cell. When data sets (0, 1), (1, 1), (0, 0) and (1, 0) to be written to a write data line are represented by voltages VD1, VD2, VD3 and VD4, respectively, where VD1, VD2, VD3, VD4, the order of the threshold voltages of the read transistor is opposite to that of the set voltages for the write data line, as shown in FIG. 25. FIG. 25 shows the relation between the word line voltage and the drain current of a read transistor. VDR, VPC, VWW, VWO, VW1, VWR1, VWR2 and VWR3 denote data line voltage, precharge voltage, write voltage, holding voltage, word line voltage of a nonselected memory cell, first read voltage, second read voltage and third read voltage, respectively.

The fourth embodiment is similar to a flash memory in reading a change in the threshold voltage caused by charge storage. The fourth embodiment does not need a verifying operation when writing information, which must be performed by the flash memory for storing two bits in one memory cell, because charge is given through the write transistor, the amount of stored charge is accurately dependent on set voltage and capacitance, and write variation is small as compared with that in a flash memory. Therefore, more than two bits can be stored in one memory cell by using more set write data line voltages.

A reading operation is the same as that for storing one bit. A read word line voltage VWR1 is between threshold high-order/low-order bit selection signal 135 to provide output data 126. A data storing operation for storing data in the memory circuit will now be described. The I/O interface generates a row address 117, a column address 118, and a high-order/low-order bit selection signal 135 according to a given address signal 116. A row decoder 132 performs a read operation for reading a selected row. The result is stored in the registers 1 and 2. Then, input data 124 is held by the register connected to a data line 129 selected by the row decoder 122. The up/down change circuit 133 selects either the register 1 or the register 2 according to the high-order/low-order bit selection signal 135. The register to which any information is written at this stage holds the information. A voltage for the write data line 130 is set on the basis of the information stored in the register 1 119 and the register 2 120, and a write pulse is given to the word line 128 for writing. Thus, only one of the two bits stored in one memory cell 131 can be rewritten.

A bit is read by the above-mentioned method and a write operation is possible. However, when a single address is assigned to one set of two bits, the upper-order bit and the lower-order bit can be simultaneously written and read, and the speed of operation can be enhanced. This can be achieved by a managing method that transfers one set of two bits between the memory and external devices and assigns one address to one set of two bits, or by a managing method that manages bits within the memory. The former method transfers data in sets each of two bits between a data I/O interface 127 and an I/O control circuit 121. Thus, the upper-order bit and the lower-order bit can be simply stored in the register 1 119 and the register 2 120, respectively. When the latter method is used, the up/down change circuit 133 allocates two-bit data of successive addresses to the register 1 and the register 2 of the same data line for a write operation, and the up/down change circuit 133 reads the data from the register 1 119 and the register 2 120 successively to send out output data 126 for a read operation. The functions of the up/down change circuit 133 may be performed by the I/O interface 127. When this method is used, a read operation that is necessary for writing one bit at a time does not need to be performed, so that the write operation can be quickly accomplished. Since both of the two simultaneously read bits can be used, data output throughput is improved. The aforesaid measures for the enhancement of operating speed are effective because an operation for the input and output of one bit is rarely performed, and an operation for the input and output of a plurality of bits or bytes is performed in most cases. The configuration of the hardware is substantially the same as that shown in FIG. 27, except that the high-order/low-order bit selection signal 135 is not necessary.

Fifth Embodiment

A fifth embodiment according to the present invention employs transistors using a semiconductor thin film, such as polysilicon film. The transistor of the fifth embodiment is basically similar to the write transistors of the foregoing embodiments. The fifth embodiment is featured by the arrangement of a source 200, a drain 201 and a channel layer. FIGS. 28(*a*) and 28(*b*) are, respectively, a typical sectional view and a top view of an essential part of a semiconductor memory device in the fifth embodiment.

A transistor is formed on an insulating film 206 which is formed on, for example, an SOI substrate. A source region and a drain region are 60 nm thick polysilicon layers, and a channel 202 is a 5 nm thick intrinsic polysilicon thin film. A gate electrode is formed from a laminated structure of a p-type polysilicon layer and a W layer. A gate insulating film 204 is an 8 nm thick $SiO_2$ film. Preferably, the polysilicon thin film is formed of intrinsic crystals. In most cases, the impurity concentration of the polysilicon thin film is $1\times10^{17}/cm^3$, and preferably, $1\times10^{15}/cm^3$.

A gate electrode 203 is formed on a gate insulating film 204. In FIG. 28(*b*), a part of a channel layer 202, forming a channel shown in FIG. 28(*a*), is denoted by a reference numeral 202.

In the fifth embodiment, an insulating film 205 underlies the thin-film channel 202, and the respective upper surfaces of the source 200, the drain 201 and the channel 202 are flush with each other. Therefore, a part of the gate insulating film, underlying the gate, is formed on a substantially flat base. Field concentration does not occur because steps are not formed in the gate insulating film, and the thickness may be small because the dielectric strength is high. If steps are formed, the thickness of the parts of the gate insulating film corresponding to the steps increases. In the foregoing configuration, the gate insulating film is formed in a uniform thickness and is excellent in short channel effect. Since the gate is not formed on a step, overetching is unnecessary, the process has a margin, and THE yield is improved. The substrate does not need to be a silicon substrate but may be a glass substrate. The source and the drain region may be p-type semiconductor layers, laminated structure metal layers, or metal and semiconductor layers. Since such a laminated structure has a low resistance, the laminated structure can be used for forming wiring lines. Since the transistor is capable of intercepting channel current through the complete depletion of the channel thin film, a switching operation can be achieved without the need for using any pn-junction. The channel may be formed of a semiconductor other than Si, such as Ge or SiGe, which increases the degree of freedom of design in threshold voltage setting or mobility. According to the present invention, semiconductor films of a thickness not greater than 5 nm are particularly preferable.

Although this transistor is similar to an ordinary n-channel MOS transistor in the dependence of the drain current on the gate voltage, the transistor has the very desirable feature of having a very small leakage current. It was confirmed through the trial manufacture of transistors and experiments conducted to evaluate the transistors that the very small leakage current is due to the effect of having no leakage path to a substrate because the transistor does not have any substrate, the effect of the complete depletion of the channel because the film is thin, and also due to the effect of a linear gray boundary that can be a leakage path. Since this semiconductor device can be formed on an insulating film and leakage current is small, the semiconductor device operates at a low power consumption and can be fabricated at a low cost. This semiconductor device may be applied when forming a logic circuit and may be applied when forming an SRAM. This semiconductor device may be applied only to a part of a logic circuit in which low leakage current is desirable, and may be applied to a resistance part of an SRAM. A memory having a long refresh cycle and which is capable of operating at a low power consumption can be realized by using the path transistor of a DRAM. Application of the transistor to other memories will be described in connection with other embodiments.

A method of fabricating the semiconductor device in the fifth embodiment will be briefly described. An n-type polysilicon film for forming the source and the drain is deposited on an insulating film. The n-type polysilicon film is etched by using a mask formed by patterning a resist film to form source and drain regions of desired shapes. As mentioned previously, the gate electrode of a transistor using the surface of a substrate, and the source and the drain region of this device may be simultaneously formed. Then, an insulting film is deposited. The insulating film is subject to a CMP process to expose the upper surfaces of the source and the drain region. A 5 nm thick nondoped amorphous silicon film for forming a channel thin film is deposited, and a t nm thick $SiO_2$ film is deposited on the nondoped amorphous silicon film. Unnecessary parts of the nondoped amorphous silicon film are etched by using a mask of a resist film. A film for forming the gate electrode is deposited and then etched by using a mask of a resist film to complete the basic structure of the device.

Sixth Embodiment

Figure 29A:
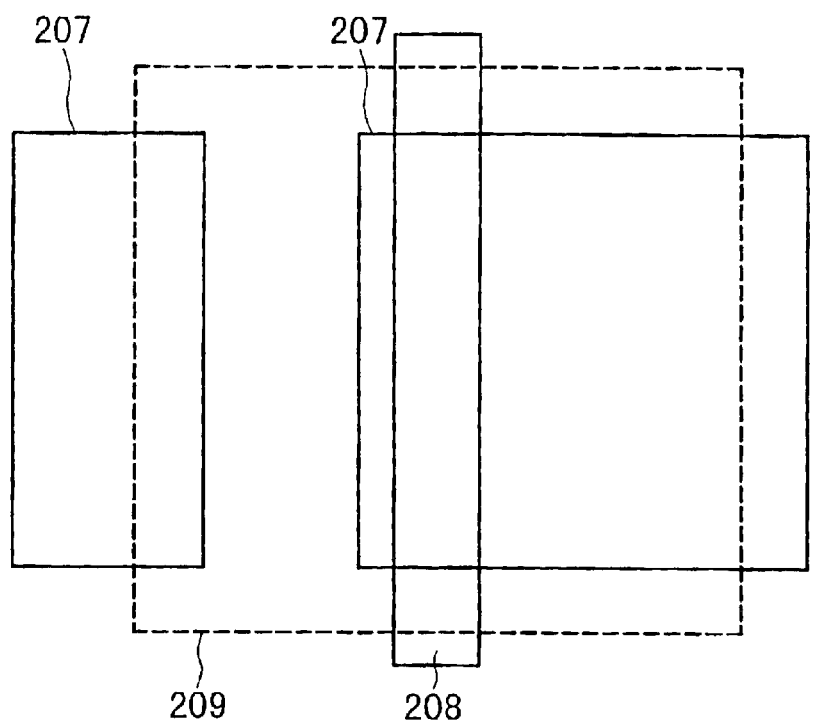
FIGS. 29(a) and 29(b) are plan views for explaining the basic composition of a transistor included in the semiconductor memory device in the fifth embodiment.
Figure 29B:
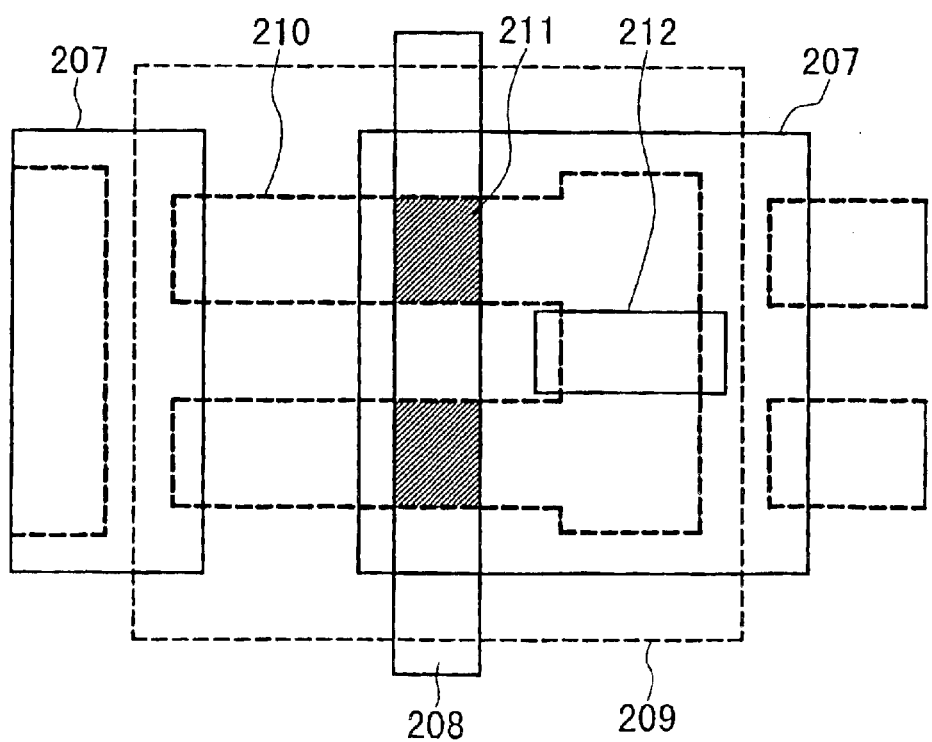
Figure 30A:
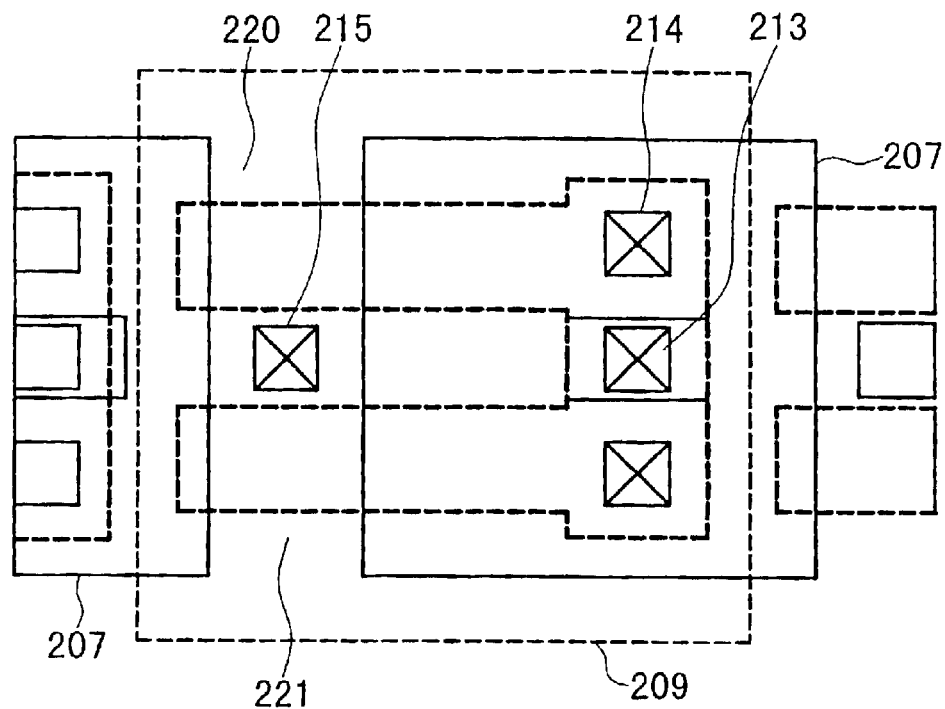
FIGS. 30(a) and 30(b) are top views for explaining a method of fabricating a semiconductor memory device in a sixth embodiment according to the present invention.
Figure 30B:
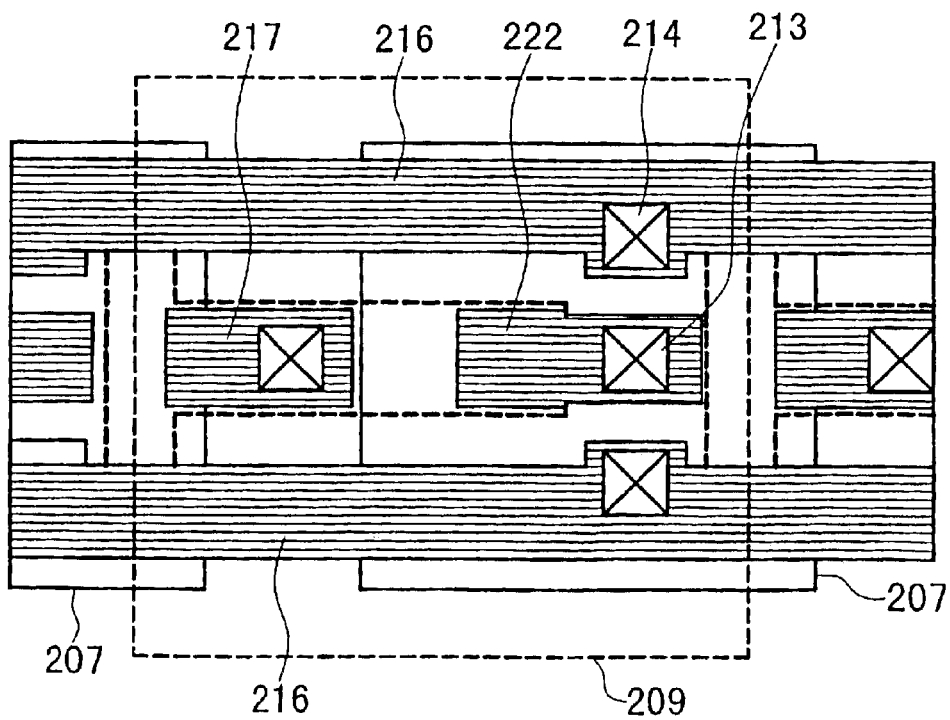
Figure 31:
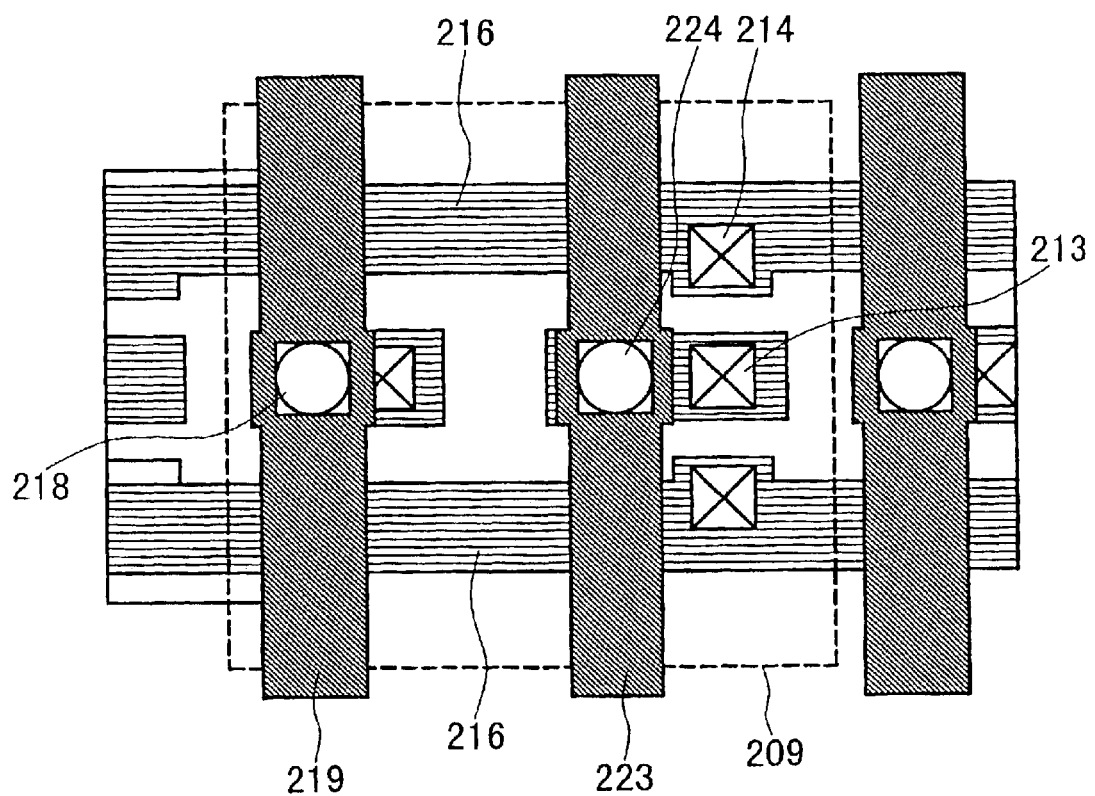
FIG. 31 is a top view for explaining a method of fabricating the semiconductor memory device in the sixth embodiment.

FIGS. 29 to 31 are views for explaining a method of fabricating a memory cell array in a sixth embodiment according to the present invention, in which parts enclosed by broken lines are unit structures each including two memory cells of the memory cell array. The unit structures are arranged in rows parallel to an X-direction, and in columns parallel to a Y-direction. to form the large-scale memory cell array. The sixth embodiment is featured by a method forming channels and is effective in reducing the thickness of a gate insulating film and enhancing reliability.

The construction will be described in connection with the steps of fabricating the memory cell array. A p-type silicon substrate is used. After accomplishing sacrifice oxidation, a deep n-type well is formed by a high-energy ion implantation process or a long annealing process. A groove is formed in an isolating region 207, an insulating film is deposited in the groove, and the insulating film is polished flat. After repeating the sacrifice oxidation, an ion implantation process and an annealing process are performed to form p-type wells. The p-type wells are electrically separated from the p-type substrate by the n-type well. Thus, the p-type wells can be set at different potentials, respectively. The surface of the substrate is oxidized to form a gate insulating film for read transistors, and then an n-type polysilicon film is deposited. The source and the drain of a write transistor are formed by processing the n-type polysilicon film. The n-type polysilicon film is etched by using a mask of a resist film provided with an opening 208 in a pattern to remove parts of the n-type polysilicon film corresponding to the openings (FIGS. 29(a)). The width of the groove determines the channel length of the transistor.

After depositing and flattening an insulating film, an amorphous silicon thin film for forming channels is deposited. An insulating film that serves as the gate insulating film of the write transistors is deposited oh the amorphous silicon thin film, a p-type polysilicon film for forming the gate electrodes of the write transistors is deposited, and the p-type polysilicon film is subjected to activate the impurity. A pattern 210 of the gate electrodes of the write transistors is formed in a mask of a resist film. Then, the p-type polysilicon film for forming the gate electrodes, the insulating film for insulating the gates of the write transistors, the amorphous silicon thin film, and the n-type polysilicon film are etched by using the mask (FIG. 29(b)). Channels for the write transistors are formed in parts 211 where the opening 208 of the mask and the pattern 210 of the mask overlap each other. An n-type impurity is implanted by using the gate pattern of the write transistors to form an extension region. Then, a Ti film (titanium film) is deposited on the surface of the substrate and the Ti film is annealed to reduce the resistance of the surface of the substrate. Subsequently, the gate electrodes are etched partly by using a pattern 212 of an opening to separate the respective gate electrodes of the two adjacent memory cells, while the gate insulating film for the write transistors and the n-type polysilicon film are not etched. Processing the amorphous silicon thin film is not performed before depositing the gate insulating film for the write transistors. Therefore, an insulating film for protecting the amorphous silicon thin film may be omitted.

In other embodiments, the protective film is damaged by a channel processing process, and, hence, another gate insulating film is formed. In the sixth embodiment, only a single insulating film is necessary. Since the insulating film is not damaged, it can be thin, which is effective in reducing the write transistor operating voltage and improving performance. Then, an insulating film is deposited and flattened, and contact holes are formed in the insulating film by using a mask of a resist film (FIG. 30(a)). A contact hole 215 in the drain region of the read transistor shared by two memory cells, a contact hole 213 in the drain region of the write transistor shared by two memory cells, a contact hole 214 which opens to the gate for both the write and the read transistor, contact holes for a peripheral circuit, and the gates of a logic circuit a and diffused regions can be simultaneously formed. The read transistors of two memory cells have source regions 220 and 221, respectively, and are wired in the X-direction by a diffused layer wiring line having a surface layer of titanium silicide. A metal film, such as a W film, is deposited and the metal film is processed by using a mask of a resist film to form metal wiring lines for a first layer (FIG. 30(b)). Word lines 216 are formed by the metal wiring lines, and a gate for both the write and the read transistor of each memory cell is extended in the X-direction. A pad 217 connected to the drain of the read transistor and a pad 222 connected to the drain of the write transistor are formed by processing the metal film. Then, an insulating film is deposited and flattened, and a second metal film is deposited and processed by using a mask of a resist film provided with openings 218 and 224 to form wiring lines of a second wiring layer (FIG. 31). The second metal film is processed to form a read data line 219 and a write data line 223 in order to extend in the Y-direction. Generally, a small current flows through the write transistor for charging and discharging a small capacity. The write data line 223 may be thinner than the read data line 219.

As is apparent from the forgoing description, the present invention provides the high-performance semiconductor memory device integrally provided with a memory and a logic circuit at a low manufacturing cost. The large-scale integrated memory according to the present invention or the semiconductor memory device provided with the large-scale integrated memory according to the present invention is capable of coping with further miniaturization.

What is claimed is:

1. A semiconductor memory device comprising:

a first transistor including a first source region, a first drain region, a first channel region of a semiconductor material formed on an insulating film and connecting the first source region and the first drain region, and a first gate electrode for controlling potential of the first channel region; and a second transistor including a second source region, a second drain region, a second channel region of a semiconductor material connecting the second source region and the second drain region, a second gate electrode for controlling potential of the second channel region, and a charge storage region coupled with the second channel region by electrostatic capacity, wherein the second source region of the second transistor is connected to a source line, one end of the first source region or the first drain region of the first transistor is connected to the charge storage region of the second transistor, and the other end of the first source region or the first drain region of the first transistor is connected to a date line, wherein the first channel region is formed on an insulating film, said first channel region being on a level corresponding to upper surfaces of the first source region and the first drain region of the first transistor, and wherein said first gate electrode extends over said first channel region and over the upper surfaces of the first source region and the first drain region of the first transistor.

2. A transistor comprising a source region, a drain region, an insulating film disposed between the source region and drain region, a first channel region of a semiconductor material connecting the source region and the drain region disposed on the insulating film and a first gate electrode disposed over the first channel region for controlling potential of the first channel region;

wherein upper surfaces of said source region and said drain region are substantially coplanar with one another, and wherein a thickness of the first channel region is thinner than a thickness of the source region and drain region, said first channel region being on a level corresponding to said upper surfaces of the source region and the drain region.

3. A semiconductor memory device comprising:

a memory cell array including memory cells including a write transistor including a first source region, a first drain region and, a first channel region of a semiconductor material formed on a first insulating film and connecting the first source region and the first drain region, and a first gate electrode to control potential of the first channel region over a first gate insulating film, a read translator including a second source region, a second drain region, a second channel region of a semiconductor material, a second gate electrode to control potential of the second channel region over a second gate insulating film, and a charge storage region coupled with the second channel region by electrostatic capacity, wherein the second source region of the read transistor is connected to a source line, one end of the first source or first drain regions of the write transistor is connected to the charge storage region of the read transistor, and the other one of the first source region or first drain region of the write transistor is connected to a data line; and a peripheral circuit including a transistor having a third gate insulating film;

wherein a thickness of the first gate insulating film is thickest among the first, second and third gate insulating film, and a thickness of the second gate insulating film is thicker than a thickness of the third gate insulating film.

4. The semiconductor memory device according to claim 3, wherein at least one of the first source region and the first drain region of the write transistor are formed on the second gate insulating film.

5. The semiconductor memory device according to claim 3, wherein the first channel region of the write transistor is on a level corresponding to an upper end of at least one of the first source region or the first drain region of the write transistor.

6. The semiconductor memory device according to claim 3, wherein a thickness of the first channel region of the write transistor is 5 nm or below.

7. The semiconductor memory device according to claim 3, wherein said first gate insulating film is formed between the first gate electrode and the first channel region, wherein the first gate electrode and the second gate electrode are comprised of a common gate electrode, wherein the charge storage region serves as a floating gate formed between said common gate electrode and said second channel region and wherein said second gate insulating film is formed between said charge storage region and said second channel region.

8. The semiconductor memory device according to claim 7, wherein said charge storage region is comprised of one of the first drain region or the first source region of the write transistor.

9. The semiconductor memory device according to claim 7, wherein said first gate insulating film is formed between said charge storage region and said common gate electrode.

10. The semiconductor memory device according to claim 9, wherein said charge storage region is comprised of one of the first drain region or the first source region of the write transistor.

* * * * *